(12) United States Patent
Takai et al.

(10) Patent No.: US 9,930,781 B2
(45) Date of Patent: Mar. 27, 2018

(54) RECEPTACLE ASSEMBLY AND MODULE ASSEMBLY

(71) Applicant: YAMAICHI ELECTRONICS CO., LTD., Tokyo (JP)

(72) Inventors: Yosuke Takai, Tokyo (JP); Toshiyasu Ito, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 15/387,941

(22) Filed: Dec. 22, 2016

(65) Prior Publication Data

US 2017/0099735 A1 Apr. 6, 2017

Related U.S. Application Data

(63) Continuation-in-part of application No. 14/816,391, filed on Aug. 3, 2015, now Pat. No. 9,565,795.

(30) Foreign Application Priority Data

Aug. 4, 2014 (JP) .................. 2014-158998

(51) Int. Cl.

| H05K 9/00 | (2006.01) |
| H05K 1/14 | (2006.01) |
| H01R 12/70 | (2011.01) |
| H05K 7/14 | (2006.01) |
| H05K 1/02 | (2006.01) |

(52) U.S. Cl.
CPC ........... H05K 1/141 (2013.01); G02B 6/4277 (2013.01); H01R 12/7076 (2013.01); H04Q 1/14 (2013.01);
(Continued)

(58) Field of Classification Search
CPC ... H01L 2224/73265; H01L 2924/3025; H01L 2924/181; H01L 2924/14; H05K 9/0058;
(Continued)

(56) References Cited

U.S. PATENT DOCUMENTS

| 4,717,989 A | 1/1988 | De Barros et al. |
| 5,506,373 A | 4/1996 | Hoffman |
| (Continued) |

FOREIGN PATENT DOCUMENTS

| JP | S60-003878 A | 1/1985 |
| JP | 2004-280261 A | 10/2004 |
| (Continued) |

OTHER PUBLICATIONS

An Office Action; "Notification of Reasons for Refusal," issued by the Japanese Patent Office on Jan. 26, 2016, which corresponds to Japanese Patent Application No. 2014-158998 and is related to U.S. Appl. No. 14/816,391; with English language partial translation.

*Primary Examiner* — Adam B Dravininkas

(74) *Attorney, Agent, or Firm* — Studebaker & Brackett PC

(57) ABSTRACT

In a receptacle assembly, a module is guided by a guide rail and held inside an opening of a printed wiring board when a plug connector of the module is connected to a host connector. The receptacle assembly includes a guide member provided on the periphery of the opening of the wiring board and configured to form a module accommodation portion to detachably accommodate the module comprising a module board and to guide the module, a connector unit provided on the wiring board and configured to electrically connect the module board of the module to the wiring board, a first EMI gasket sealing a gap between a lower end portion of a connector cover covering the connector unit and the wiring board, and a second EMI gasket sealing a gap between a connecting end portion of the module and the periphery of an opening of the connector unit.

4 Claims, 25 Drawing Sheets

(51) Int. Cl.
*G02B 6/42* (2006.01)
*H04Q 1/14* (2006.01)
*H05K 7/20* (2006.01)

(52) U.S. Cl.
CPC ......... *H05K 1/0203* (2013.01); *H05K 7/1461* (2013.01); *H05K 7/20545* (2013.01); *H05K 9/0015* (2013.01); *H05K 9/0062* (2013.01); *G02B 6/4284* (2013.01); *H05K 2201/10189* (2013.01)

(58) Field of Classification Search
CPC ........... H05K 1/18; H05K 2201/10189; H05K 9/0015; H05K 9/0016; H05K 7/2039; H05K 7/1461; H05K 7/1092; H05K 7/20418; H05K 7/20545; H05K 9/0062; H05K 1/141; G02B 6/4277; G02B 6/4284; H04Q 1/14
See application file for complete search history.

(56) References Cited

U.S. PATENT DOCUMENTS

| | | | | |
|---|---|---|---|---|
| 5,757,998 | A * | 5/1998 | Thatcher | G02B 6/4201 385/75 |
| 6,178,096 | B1 | 1/2001 | Flickinger et al. | |
| 6,304,436 | B1 | 10/2001 | Branch et al. | |
| 7,021,540 | B2 * | 4/2006 | Kimura | G06F 1/183 235/441 |
| 7,852,633 | B2 | 12/2010 | Ito | |
| 7,961,473 | B1 * | 6/2011 | Bohannon | H01L 23/4006 165/80.3 |
| 8,014,153 | B2 | 9/2011 | Ice | |
| 9,549,470 | B2 * | 1/2017 | Blier | H05K 1/189 |
| 2002/0197043 | A1 | 12/2002 | Hwang | |
| 2008/0212277 | A1 * | 9/2008 | Aoto | H05K 5/0295 361/679.54 |
| 2010/0039778 | A1 | 2/2010 | Ice | |
| 2010/0039785 | A1 * | 2/2010 | Ice | G02B 6/4201 361/785 |
| 2010/0124030 | A1 | 5/2010 | Ice | |
| 2014/0087577 | A1 | 3/2014 | Oki | |
| 2014/0154912 | A1 | 6/2014 | Hirschy | |
| 2015/0092363 | A1 * | 4/2015 | Blier | H05K 1/189 361/749 |

FOREIGN PATENT DOCUMENTS

| | | |
|---|---|---|
| JP | 2005-222537 A | 5/2005 |
| JP | 2012-109165 A | 6/2012 |
| JP | 2012-239025 A | 12/2012 |

* cited by examiner

RECEPTACLE ASSEMBLY AND MODULE ASSEMBLY

This application is a continuation-in-part of application Ser. No. 14/816,391 filed on Aug. 3, 2015, which claims the benefit of Japanese Patent Application No. 2014-158998 filed Aug. 4, 2014. The disclosures of the prior applications are hereby incorporated by reference herein in their entirety.

BACKGROUND OF THE INVENTION

Field of the Invention

The present invention relates to a receptacle assembly including a heat sink body, and to a module assembly.

Description of the Related Art

Transceiver module assemblies have been put into practical use in optical communication systems in order to transmit an optical signal transported through an optical connector and the like to a mother board. Such a transceiver module assembly comprises, for example, a module and a receptacle assembly to which the module is detachably mounted. As disclosed in U.S. Pat. No. 7,852,633, for instance, a receptacle assembly such as a connector for connection to a module board is placed on a printed wiring board in a housing. As its main components, the receptacle assembly comprises: a guide rail member having an accommodating portion which detachably accommodates the module; a heat sink unit which dissipates heat from the module; an eject mechanism which holds the module provided in the accommodating portion and selectively ejects the module toward the outside; and a host connector which electrically connect contact pads of a module board of the loaded module and a conductive pattern of the printed wiring board, and a board connector.

The heat sink unit comprises: a heat sink body having a plurality of heat-dissipation fins on one of its surfaces; a thermally conductive sheet and a slide sheet which are stacked in this order on a raised portion of the heat sink body and fixed thereto; and a fixing frame member which fixes the thermally conductive sheet and the slide sheet to the heat sink body. On the one surface of the heat sink body, the heat-dissipation fins each having an approximately rectangular cross section are formed in parallel to one another at predetermined intervals.

In the above-described configuration, the heat sink unit is lifted up merely by inserting the module into the module accommodating portion, and a casing of the module comes into contact with the slide sheet. Hereby, the heat generated from the module is dissipated via the thermally conductive sheet, the slide sheet, and the heat sink unit.

SUMMARY OF THE INVENTION

When the above-described transceiver module assembly is placed on a mounting surface of the printed wiring board in the housing, it is desirable to reduce a height from the mounting surface of the printed wiring board to an upper end surface of the heat sink body of the receptacle assembly to meet a demand for reduction in thickness of the housing.

However, in the above-described structure in which the heat sink body has the heat-dissipation fins on one of its surfaces, there are limitations in reducing the thickness of the heat sink body and offering a low-profile of the receptacle assembly.

In view of the above-described problem, the present invention aims to provide a receptacle assembly including a heat sink body, and to provide a module assembly. The receptacle assembly and module assembly can achieve a low-profile of the receptacle assembly.

To achieve the above-described object, a receptacle assembly according to the present invention comprises: a guide member provided on the periphery of an opening of a wiring board which has the opening, and configured to form a module accommodation portion to detachably accommodate a module comprising a module board, and configured to guide the module; a connector unit provided on the wiring board at a position adjacent to the module accommodation portion, and configured to electrically connect the module board of the module to the wiring board; a first EMI gasket sealing a gap between a lower end portion of a connector cover covering the connector unit and the wiring board; and a second EMI gasket sealing a gap between a connecting end portion of the module and the periphery of an opening of the connector unit when the module is placed to the module accommodation portion through the opening of the connector unit. When the module is accommodated by the module accommodation portion, a position of a lower end portion of the module is positioned at a position lower than a position of the wiring board through an opening of the wiring board.

In addition, the receptacle assembly may further comprise a bracket to form a guide slot of the accommodation portion to allow passage of the module. The bracket may be configured to block entry of the module when the module in an incorrect position is about to be placed to the module accommodation portion.

Moreover, a shape of the guide slot of the bracket may correspond to a cross-sectional shape of the module so as to allow passage of the module. The guide slot may include a first recessed portion, a second recessed portion, and a third recessed portion communicating with the first recessed portion via the second recessed portion. A width dimension of the first recessed portion in an orthogonal direction to a direction of placement of the module may be different from a width dimension of the third recessed portion. In addition, the shape of the guide slot of the bracket may correspond to the cross-sectional shape of the module so as to allow passage of the module. The guide slot may include the first recessed portion, the second recessed portion, and the third recessed portion communicating with the first recessed portion via the second recessed portion. Here, an engagement piece, which is to be engaged with a groove formed at a predetermined position on an outer peripheral portion of the module, may be formed on the periphery of the third recessed portion.

Furthermore, the shape of the guide slot of the bracket may correspond to a cross-sectional shape of the module so as to allow passage of the module. The guide slot may comprise the first recessed portion, the second recessed portion, and the third recessed portion communicating with the first recessed portion via the second recessed portion. An engagement piece, which is to be engaged with a corner portion formed at a predetermined position on an outer peripheral portion of the module, may be formed on the periphery of the third recessed portion. The receptacle assembly may further comprise a heat sink body having a heat-dissipation portion provided adjacent to an outer peripheral portion of the guide member, the heat sink body being provided across the guide member.

A module assembly according to the present invention comprises: a module including a module board having a connecting end portion located on one end portion of the module board; and any one of the above-described receptacle assemblies.

According to the receptacle assembly and the module assembly of the present invention, because when the module is accommodated by the module accommodation portion, a position of the lower end portion of the module is positioned at the position lower than the position of the wiring board through the opening of the wiring board, it is possible to achieve a low-profile of the receptacle assembly.

Further features of the present invention will become apparent from the following description of exemplary embodiments (with reference to the attached drawings).

BRIEF DESCRIPTION OF THE DRAWINGS

FIG. 15A is a front view showing an example of a bracket used in the example shown in FIG. 12, while

FIG. 16A is a front view showing another example of a bracket used in the example shown in FIG. 12, while

FIG. 17A is a front view showing still another example of a bracket used in the example shown in FIG. 12, while

FIG. 18A is a front view showing yet another example of a bracket used in the example shown in FIG. 12, while

DESCRIPTION OF THE EMBODIMENTS

Figure 2:
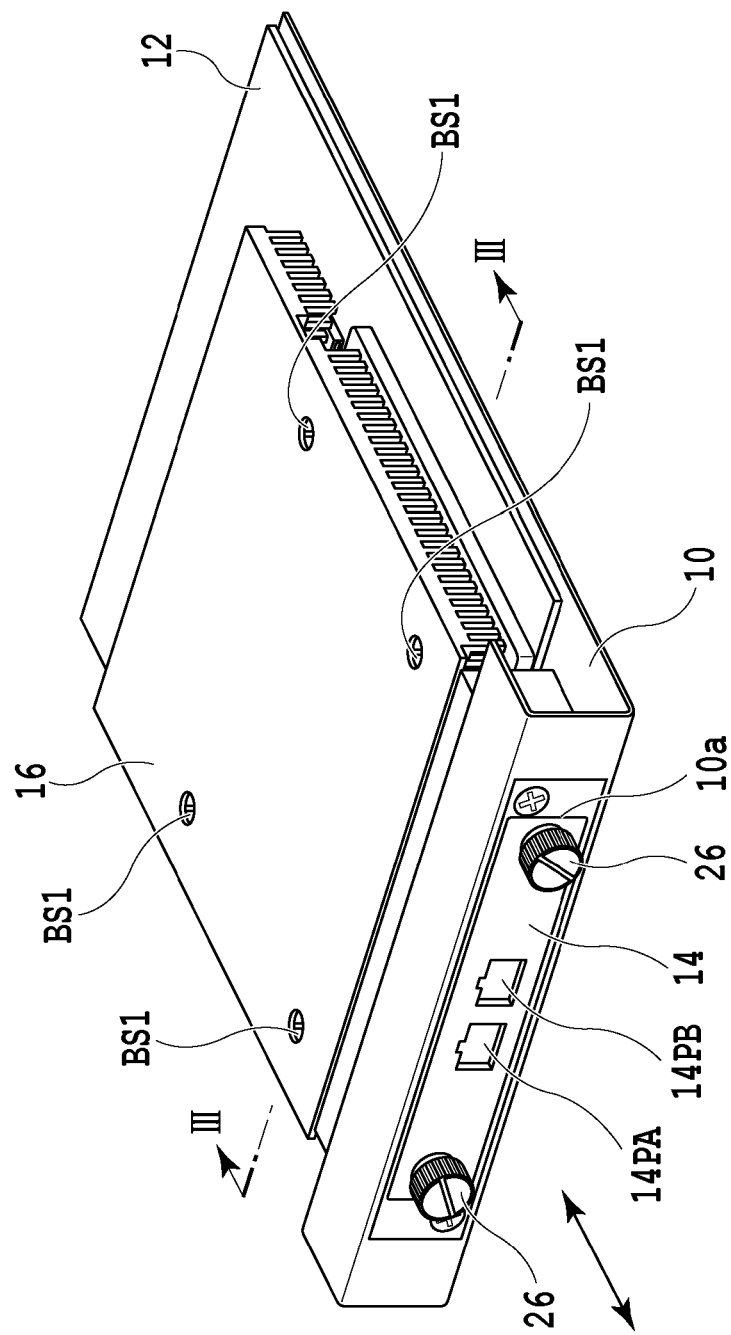
FIG. 2 is a perspective view showing the external appearance of the module assembly according to the first embodiment of the present invention.

FIG. 2 shows a first embodiment of a receptacle assembly according to the present invention together with a module.

A plurality of receptacle assemblies shown in FIG. 2 are arranged in parallel on a support panel 10 in a certain electronic device. Note that FIG. 2 shows one receptacle assembly supported by the support panel 10 on behalf of the plurality of receptacle assemblies. An example of a module assembly according to the present invention comprises a module 14 to be described later, and the receptacle assembly.

Figure 1:
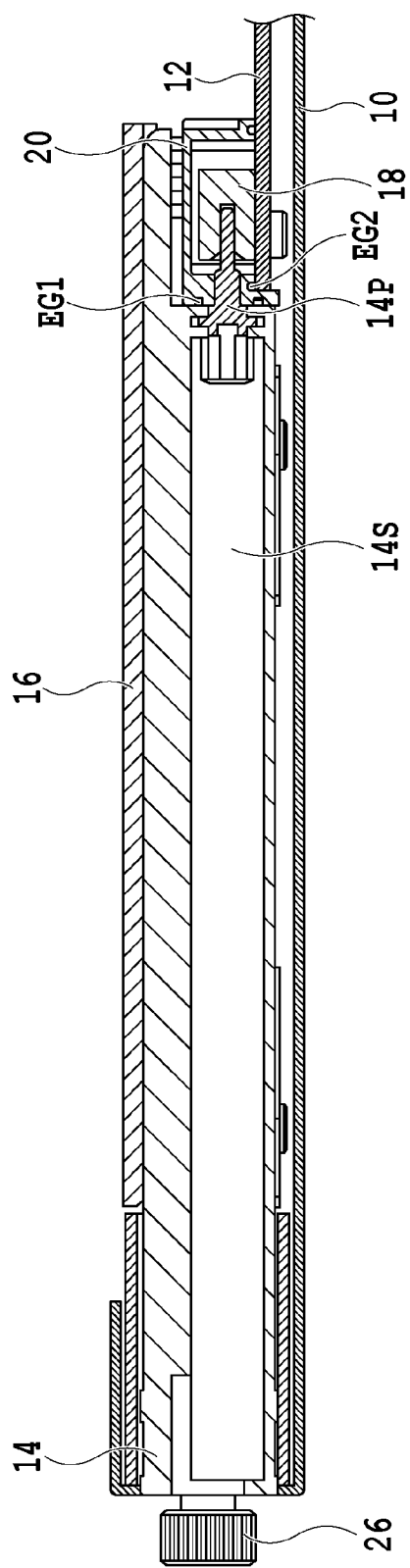
FIG. 1 is a cross-sectional view showing a configuration of a module assembly according to a first embodiment of the present invention.

As shown in FIG. 1, the module 14 comprises, as its main components, an upper case and a lower case made of metal and forming a contour portion, and a module board 14S to be positioned at a predetermined position in an accommodation space defined between the upper case and the lower case.

The upper case as an upper member has an opened lower end. A protection wall shaped like thin sheet being continuous with an upper surface and the two side surfaces of the upper case and projecting in a longitudinal direction is formed at one end portion of the upper case. The protection wall is provided for protecting a plug connector 14P to be described later in case the module 14 is dropped by mistake.

As shown in FIG. 1, the module board 14S has an electrode unit which is provided on one end portion thereof and constitutes the plug connector 14P serving as a connecting end portion. A plurality of contact pads are arranged in parallel to one another at predetermined intervals on common planes on front side and back surfaces of the electrode unit which is formed at a tip end portion of the plug connector 14P.

The lower case as a lower member is fixed to a lower end of the upper case in such a way as to cover an opening at the lower end of the upper case described above.

Although the above-described module board 14S has the plug connector 14P as the connecting end portion, the present invention is not limited only to this configuration. For example, the module board may have a card edge terminal, instead of the plug connector, as the connecting end portion at its tip end portion.

An optical connector connected to an end of an optical cable (not shown) is connected to each of ports 14PA and 14PB provided at an end portion of the module 14 shown in FIG. 2. The other end of each optical cable is connected to an optical connector of another housing constituting a not-illustrated communication system. It should be noted that the ports of the module 14 are not limited only to this example, and for instance, the ports may be designed to connect coaxial connectors which are connected to coaxial cables.

Fixing screws 26 for fixing the module 14 to a connector cover 20 to be described later longitudinally penetrate through-holes, respectively, which are formed at the two side portions of the upper case. A knob of each fixing screw 26 is exposed on the end surface of the module 14 where the ports 14PA and 14PB are opened. A male screw part which is screwed into a female screw part of the connector cover 20 is formed at a tip end of each fixing screw 26.

The receptacle assembly is supported by the support panel 10. A rectangular opening 10a allowing passage of the module 14 in directions indicated with arrows shown in FIG. 2, i.e., in directions of attachment and detachment, is formed at a central part of an end portion the support panel 10, which is one of its short sides that is folded. Holes to allow insertion of machine screws BS4, which are configured to fix a bracket 24 to be described later to the support panel 10, are formed at two positions around the opening 10a (see FIG. 8).

Figure 4:
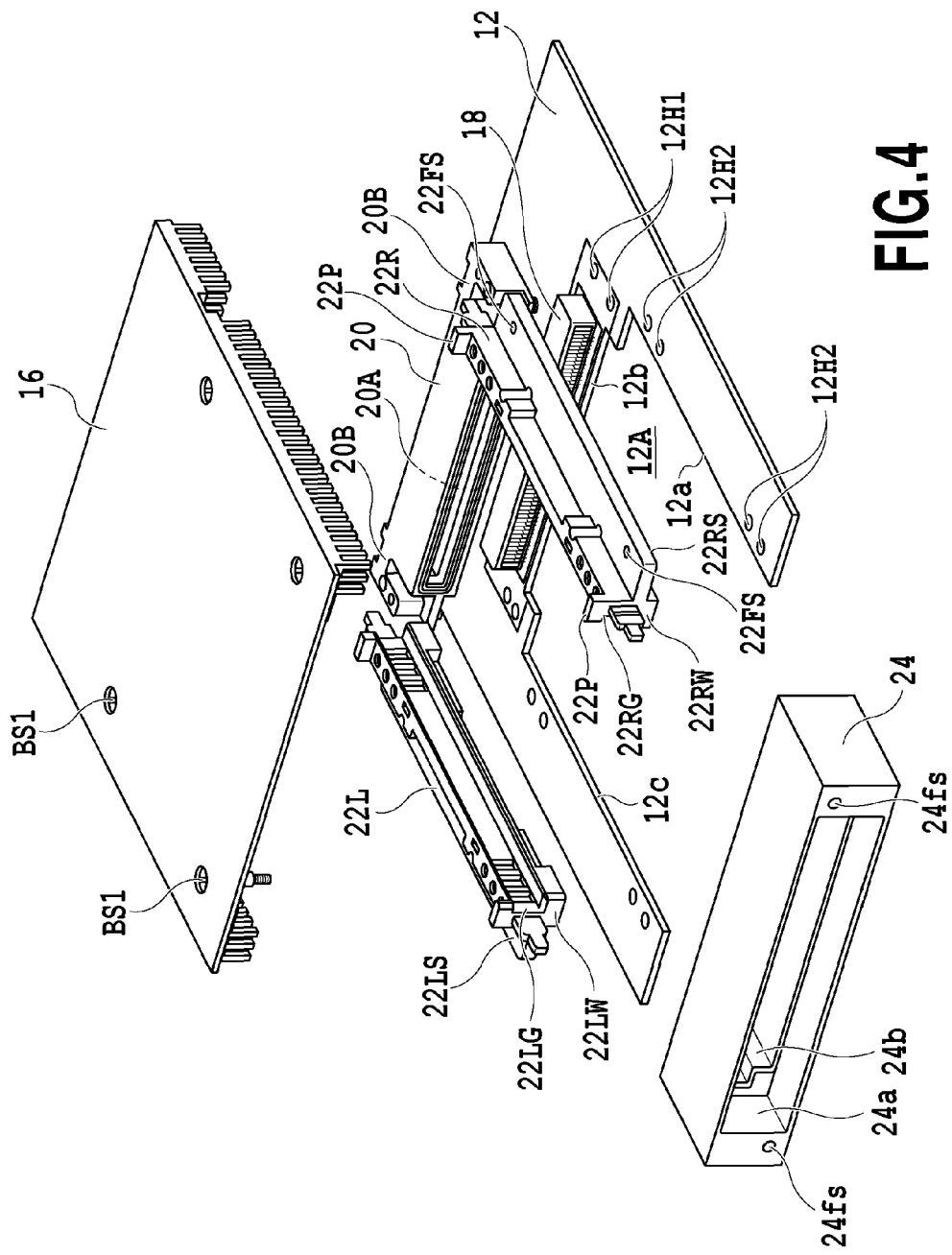
FIG. 4 is an exploded perspective view showing a configuration of the first embodiment of a receptacle assembly according to the present invention.

As shown in FIG. 4, the receptacle assembly comprises, as its main components: the bracket 24 which guides the module 14 when the module 14 is attached or detached; a pair of guide rail members 22R and 22L constituting an accommodation portion which detachably receives the module 14 through the bracket 24; a heat sink unit which dissipates heat generated from the module 14; a host connector 18 which electrically connects the contact pads of the plug connector 14P of the attached module 14 and a conductive pattern of a printed wiring board 12; and the connector cover 20 which covers the host connector 18.

The bracket 24 has a guide slot provided at a central part in such a way as to penetrate the bracket along its short sides. The guide slot is comprised of: a first hole portion 24a which allows insertion of the end portion of the module 14 where the knobs of the fixing screws 26 described above are exposed; and a second hole portion 24b which communicates with the first hole portion 24a and has guide walls. Female screw holes 24fs into which the machine screws BS4 are screwed are formed at two positions around an open end of the first hole portion 24a. The two side portions of the module 14 passing through the second hole portion 24b come into slidable contact with the guide walls at an inner peripheral portion of the second hole portion 24b.

The printed wiring board 12 has an opening 12A provided at a central part thereof. The opening 12A is formed and surrounded by guide rail placement portions 12a and 12c opposed to each other, and a connector support portion 12b connecting end portions of the guide rail placement portions 12a and 12c.

Each of the guide rail placement portions 12a and 12c extends in the directions of attachment and detachment of the module 14.

Because the guide rail placement portion 12a to support the guide rail member 22R and the guide rail support portion 12c to support the guide rail member 22L have the same structure, the guide rail placement portion 12a will be described below while omitting the description of the guide rail support portion 12c. The guide rail placement portion 12a has a plurality of holes 12H2 provided at predetermined positions, into which machine screws BS2 (see FIG. 6) to be described later for fixing the guide rail member 22R to the printed wiring board 12 are inserted. Hereby, the guide rail members 22R and 22L serving as guide members are fixed to the guide rail placement portions 12a and 12c, respectively, by screwing the machine screws BS2 into female screw holes to be described later via the holes 12H2.

The host connector 18 is provided on the connector support portion 12b which supports the connector cover 20 and the host connector 18. The connector support portion 12b has a pair of holes 12H1 provided at either end thereof and adjacent to the host connector 18, into which machine screws BS3 (see FIG. 6) for fixing the connector cover 20 to the printed wiring board 12 are inserted.

Figure 3:
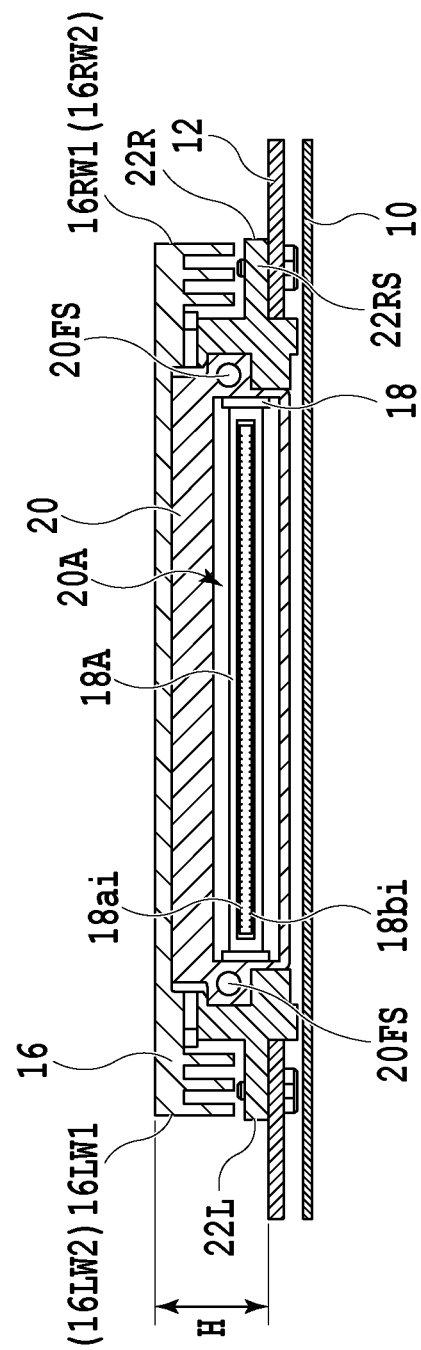
FIG. 3 is a cross-sectional view taking along the III-III line in FIG. 2.

As shown in FIG. 3, the host connector 18 comprises a connector insulator having a slot 18A into which the plug connector 14P of the module 14 is detachably inserted, and a plurality of contact terminals 18ai and 18bi (i=1 to n, n is a positive integer). The contact terminals 18ai and 18bi are provided to electrically connect the plug connector 14P of the module 14 to a group of electrodes connected to the conductive pattern of the printed wiring board 12.

For example, a plurality of slits at predetermined intervals in a longitudinal direction in FIG. 3 are formed on the periphery of the slot 18A of the connector insulator molded of a resin material. The adjacent slits are separated from one another by partition walls. In each slit, a movable contact portion (not shown) of the contact terminal 18ai and a movable contact portion (not shown) of the contact terminal 18bi are disposed opposite to each other. Fixing terminals of the contact terminals 18ai and 18bi of the host connector 18 are soldered to the conductive pattern of the printed wiring board 12. The host connector 18 is covered with the connector cover 20.

The connector cover 20 is made of a metal material, for example. As shown in FIG. 3, the connector cover 20 comprises a connector accommodation portion 20A, and guide rail support portions 20B formed integrally on both sides of the connector accommodation portion 20A and designed to support ends of the guide rail members 22R and 22L to be described later.

The connector accommodation portion 20A is provided with a slot to allow passage of the plug connector 14P of the module 14 when the module 14 is attached or detached, and configured to accommodate the host connector 18 inside and to cover the host connector 18 while retaining given clearances. The slot of the connector accommodation portion 20A is formed in face-to-face relationship with the slot 18A of the host connector 18 described above. As shown in FIG. 3, female screw parts 20FS into which the above-described male screw parts of the fixing screws 26 are screwed are formed at two positions near both ends on the periphery of the slot. In addition, as shown in FIG. 1, a groove into which an annular EMI gasket EG1 serving as a first EMI gasket is inserted is formed around the periphery of the slot. Moreover, a groove into which an annular EMI gasket EG2 serving as a second EMI gasket is inserted is formed in a lower end surface of the connector cover 20. The EMI gasket EG2 comes into contact with an end of the connector support portion 12b of the printed wiring board 12 defining the opening 12A. In this case, as shown in FIG. 1, an end portion of the connector cover 20 is engaged with an edge of the opening 12A opposed to the connector support portion 12b and projects into the opening 12A.

Hereby, as shown in FIG. 1, when the plug connector 14P of the module 14 is connected to the host connector 18, an end surface of the module 14 from which the plug connector 14P projects comes into contact with the EMI gasket EG1 on the periphery of a slot 20A of the connector cover 20, and the EMI gasket EG2 comes into contact with the end of the connector support portion 12b of the printed wiring board 12 forming the opening 12A. Accordingly, noise generated in the host connector 18 is confined to the inside of the connector accommodation portion 20A.

An engagement portion (not shown), with which one end of the corresponding one of the guide rail members 22R and 22L comes into engagement, is formed to each guide rail support portion 20B at a position adjacent to the female screw part 20FS. In addition, female screw holes (not shown) through which the above-described machine screws BS3 are screwed via the holes 12H1 in the printed wiring board 12 are formed inside the guide rail support portions 20B in a substantially perpendicular direction to a mounting surface of the printed wiring board 12.

The guide rail member 22R is molded from a resin material, for example. As shown in FIG. 4, the guide rail member 22R comprises: a guide wall portion 22RW which guides and holds one of the side portions of the module 14; and a flange portion 22RS formed integrally with the guide wall portion 22RW and fixed to the guide rail placement portion 12a of the printed wiring board 12.

As shown in FIG. 3, the flange portion 22RS extends sideways in a direction substantially perpendicular to one of outer peripheral surfaces of the guide wall portion 22RW and substantially parallel to the guide rail placement portion 12a. As shown in FIG. 4, the flange portion 22RS is provided with a plurality of female screw holes 22FS at a predetermined interval corresponding to the holes 12H2 in the printed wiring board 12. As shown in FIG. 3, groups of fins 16RW1 and 16RW2 of a heat sink body 16 to be described later are placed in a space partitioned by the one outer peripheral surface of the guide wall portion 22RW and the flange portion 22RS.

A proximal end of the flange portion 22RS is connected to the guide wall portion 22RW at a position some distance from a lower end position of the guide wall position 22RW toward an upper end of the guide wall portion 22RW, e.g. a position away by a predetermine height greater than a plate thickness of the printed wiring board 12. Herewith, the lower end of the guide wall portion 22RW penetrates the opening 12A toward the support panel 10 and projects downward from the printed wiring board 12. In this case, as shown in FIG. 3, the lower end of the guide wall portion 22RW is located on a common plane with the end portion of the connector cover 20 projecting to the opening 12A. Accordingly, aback surface of the printed wiring board 12 and the periphery of the slot of the connector cover 20 corresponding thereto are located substantially on a common plane.

The guide wall portion 22RW has protrusions which are formed on two ends in the longitudinal direction and are to be engaged with the engagement portion of the above-described guide rail support portion 20B and an engagement portion of the bracket 24, respectively.

A guide groove 22RG which guides and holds one of the side portions of the module 14 is formed in the longitudinal direction on the other outer peripheral surface of the guide wall portion 22RW.

Female screw holes are formed at two positions of an upper part of the guide wall portion 22RW. Machine screws BS1 for fixing the heat sink body 16 to be described later to the guide rail member 22R are screwed into the female screw holes. Protrusions 22P for positioning the heat sink body 16 with respect to the guide rail member 22R are formed at positions adjacent to the female screw holes. Tip end portions of the protrusions 22P are engaged with relatively shallow positioning grooves 16G1 and 16G2 (see FIG. 5) of the heat sink body 16, respectively.

In the meantime, the guide rail member 22L is molded from a resin material, for example. As shown in FIG. 4, the guide rail member 22L comprises: a guide wall portion 22LW which guides and holds the one of the side portions of the module 14; and a flange portion 22LS formed integrally with the guide wall portion 22LW and fixed to the guide rail placement portion 12c of the printed wiring board 12. Because the configurations of the guide wall portion 22LW and the flange portion 22LS are the same as those of the guide wall portion 22RW and the flange portion 22LS described above, respectively, the explanation thereof will be omitted.

Figure 5:
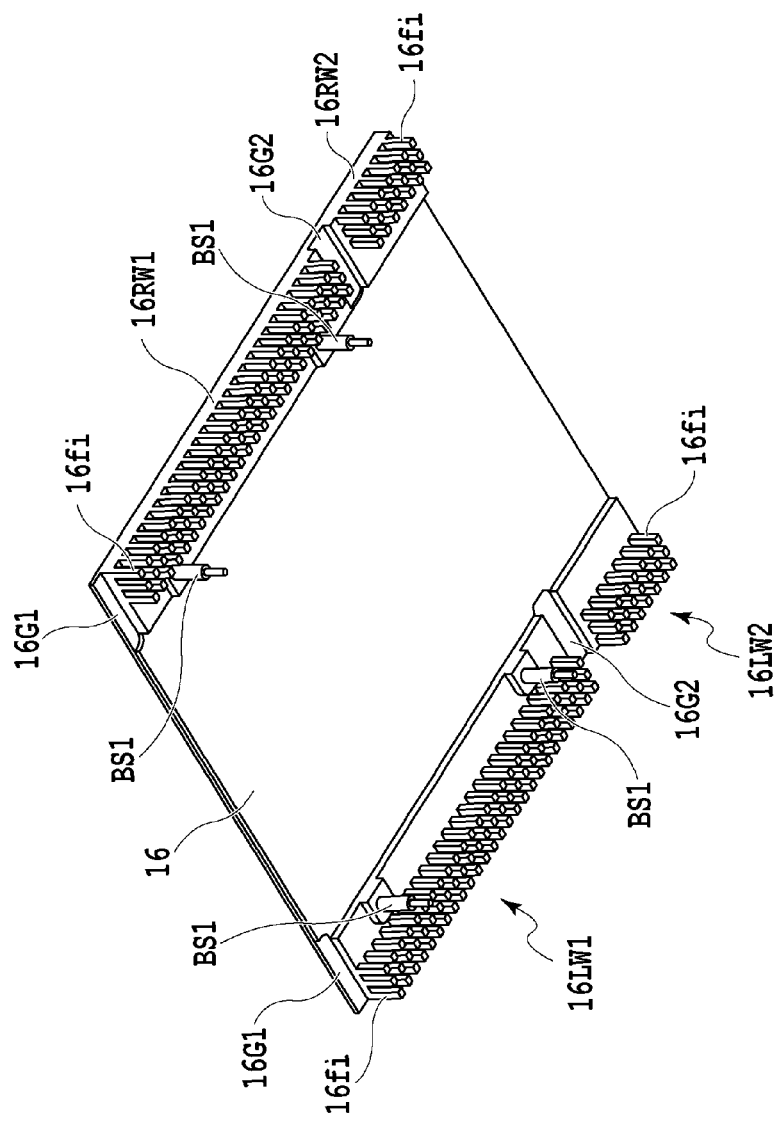
FIG. 5 is a perspective view showing a heat sink body used in the example shown in FIG. 2.

As shown in FIG. 5, the heat sink unit comprises the heat sink body 16, and the four machine screws BS1 for fixing the heat sink body 16 to upper ends of the guide rail member 22W and the guide rail member 22L described above.

The heat sink body 16 is molded from metal having fine heat conductivity such as an aluminum alloy as shaped in a thin sheet. The groups of fins 16RW1 and 16RW2 and groups of fins 16LW1 and 16LW2 are formed opposite to one another, respectively, on both ends of a surface of the heat sink body 16 which is opposed to the upper ends of the guide rail member 22W and the guide rail member 22L. Because structures of the groups of fins 16RW1 and 16RW2 are the same as structures of the groups of fins 16LW1 and 16LW2, the groups of fins 16RW1 and 16RW2 will be described below and explanation of the groups of fins 16LW1 and 16LW2 will be omitted.

The group of fins 16RW1 are comprised of a plurality of fins 16fi (i=1 to n, n is a positive integer) each having a rectangular cross section. The fins 16fi are formed at predetermined intervals in three lines parallel to one another and in the longitudinal direction of the heat sink body 16. The relatively shallow positioning grooves 16G1 and 16G2 are formed near the two end portions of the group of fins 16RW1, respectively. The group of fins 16RW2 are formed adjacent to the positioning groove 16G2. A length of arrangement of the group of fins 16RW2 in the longitudinal direction of the heat sink body 16 is set shorter than a length of arrangement of the group of fins 16RW1. The group of fins 16RW2 are comprised of a plurality of fins 16fi (i=1 to n, n is a positive integer) each having a rectangular cross section. The fins 16fi are formed at predetermined intervals in three lines parallel to one another and in the longitudinal direction of the heat sink body 16.

The machine screws BS1 are provided between the group of fins 16RW1 and the group of fins 16LW1 and beside the group of fins 16RW1 and the group of fins 16LW1, respectively, at a predetermined interval corresponding to the female screw holes in the guide rail member 22W and the guide rail member 22L described above. When the heat sink unit is attached to the guide rail member 22W and the guide rail member 22L, the position of the slot of the connector cover 20 is set to a position closer to the mounting surface of the printed wiring board 12 as shown in FIG. 3. Moreover, because no fins are provided on a flat upper surface of the heat sink body 16, a height H from the mounting surface of the printed wiring board 12 to the flat upper surface of the heat sink body 16 is set to a relatively low-profile.

Figure 6:
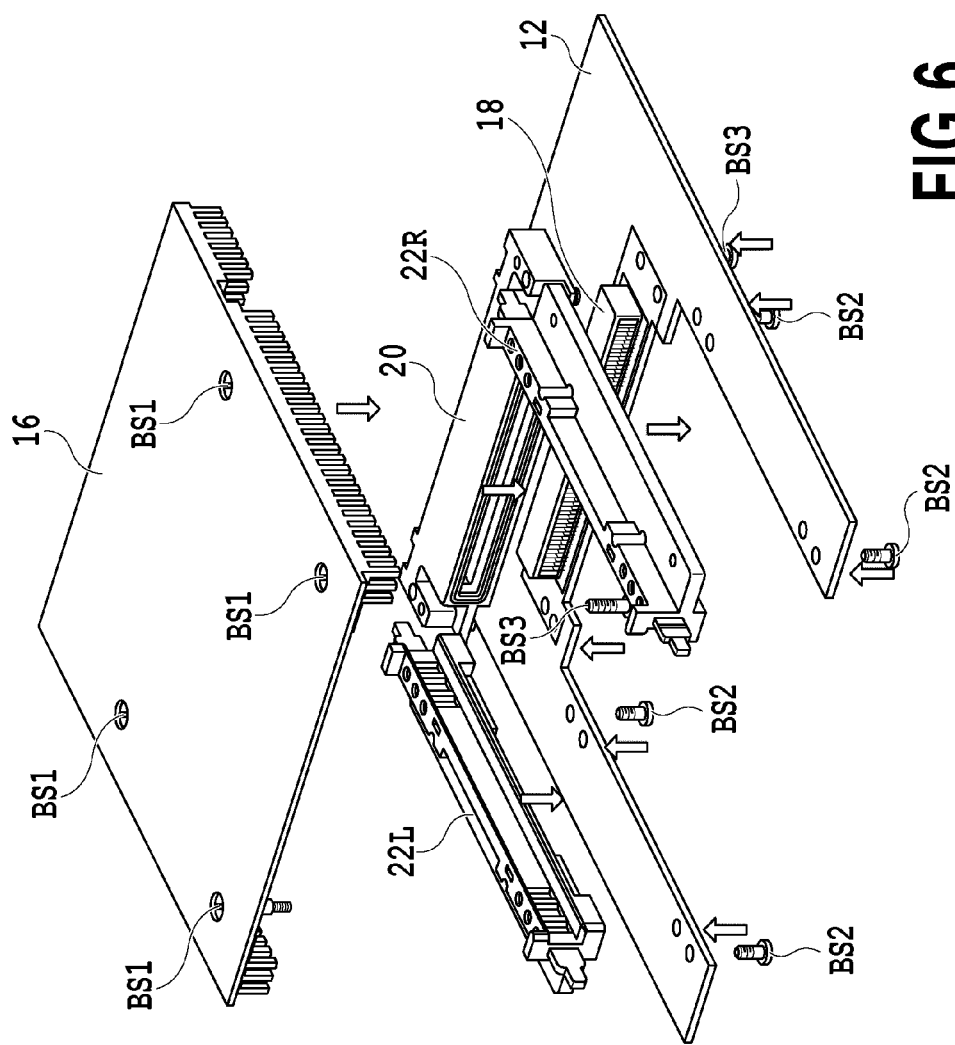
FIG. 6 is an exploded perspective view made available for explaining assembling procedures in the example shown in FIG. 4.
Figure 7:
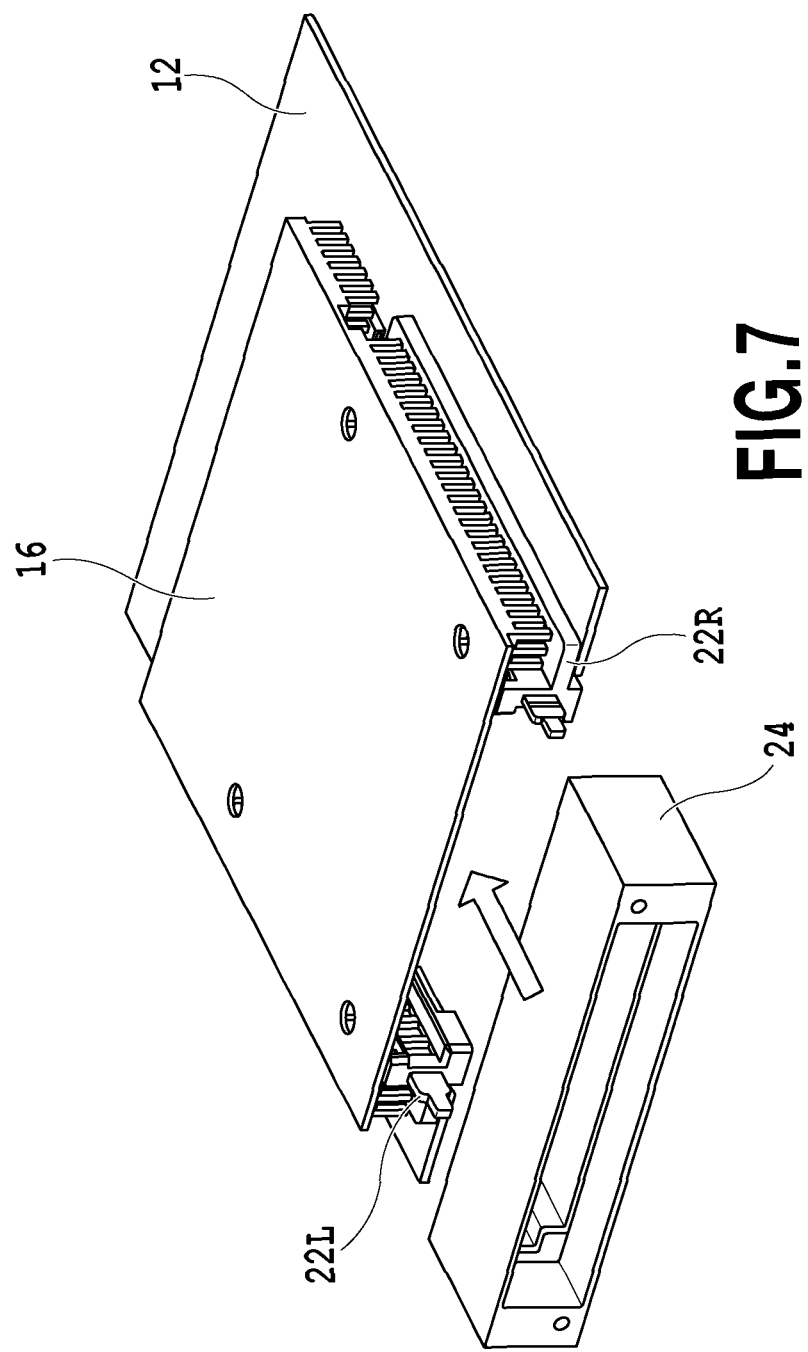
FIG. 7 is another exploded perspective view made available for explaining the assembling procedures in the example shown in FIG. 4.
Figure 8:
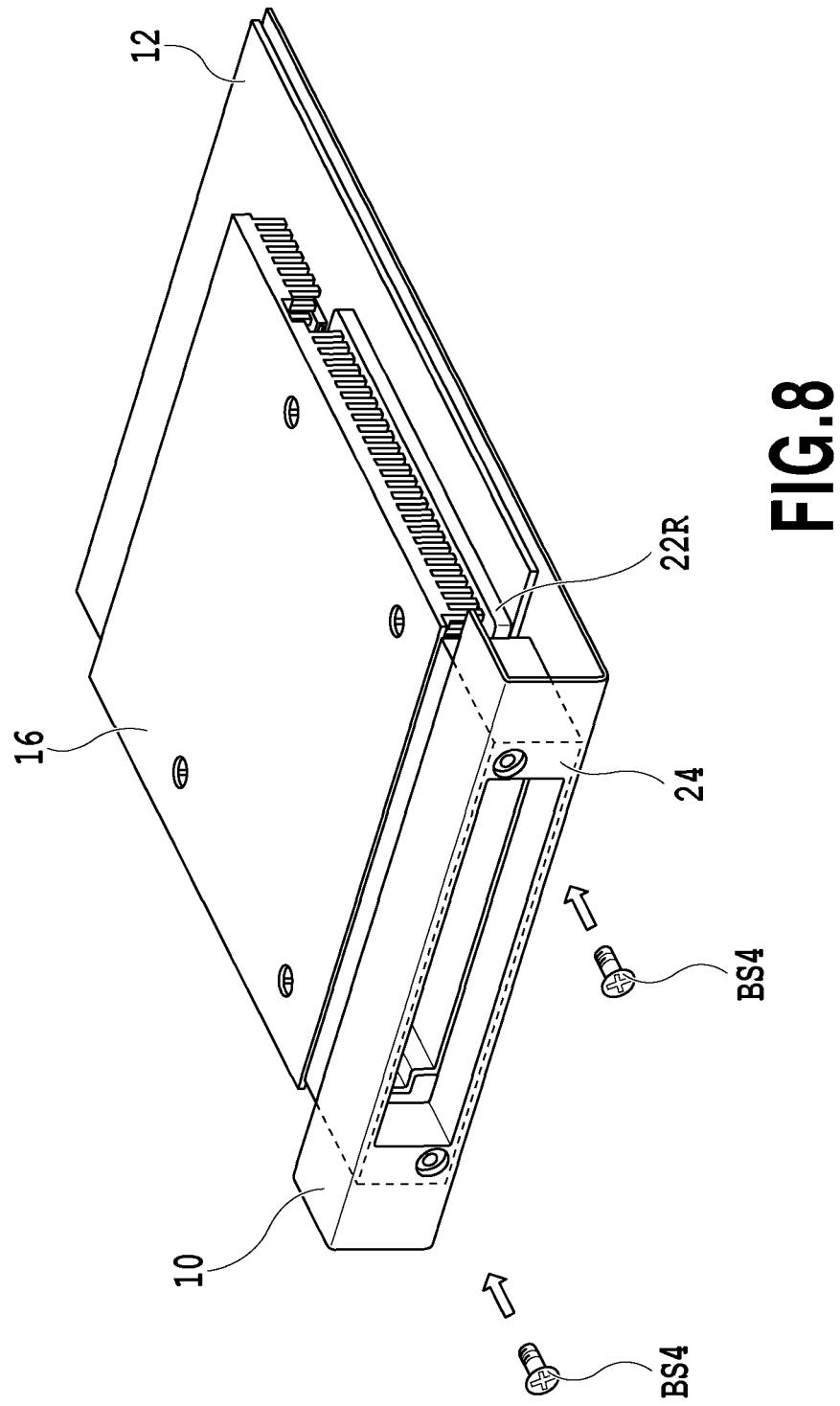
FIG. 8 is a perspective view made available for explaining the assembling procedures in the example shown in FIG. 4.

In the case of assembling the receptacle assembly, after the host connector 18 is first fixed to the connector support portion 12b of the printed wiring board 12 as shown in FIG. 6, the host connector 18 is secondly covered with the connector cover 20 and then the connector cover 20 is fixed to the connector support portion 12b with the machine screws BS3. Subsequently, the ends of the guide rail members 22R and 22L are inset into the engagement portions of the connector cover 20, respectively, and then the guide rail members 22R and 22L are fixed to the guide rail placement portions 12a and 12c with the machine screws BS2. Next, as shown in FIG. 7, after the guide rail members 22R and 22L are disposed to face other between the group of fins 16RW1 and the group of fins 16LW1 of the heat sink body 16, and then the heat sink body 16 is fixed to the upper ends of the guide rail members 22R and 22L with the machine screws BS1. Then, as shown in FIG. 7, the other ends of the guide rail members 22R and 22L are opposed to the bracket 24, and the bracket 24 is brought closer in a direction indicated with an arrow. Thus, the other ends of the guide rail members 22R and 22L are inset into the engagement portions of the bracket 24, respectively. Then, the opening 10a of the support panel 10 and the open end of the bracket 24 are brought to face each other. Thereafter, as shown in FIG. 8, the support panel 10 is fixed to the bracket 24 with the machine screws BS4. Thus, the receptacle assembly is fixed to the support panel 10 in such a way as to form a predetermined clearance between the back surface of the printed wiring board 12 and the support panel 10.

In the above-described configuration, when the plug connector 14P of the module 14 is connected to the host connector 18, the module 14 is guided by the guide rail members 22R and 22L and held inside the opening 12A of the printed wiring board 12 as shown in FIG. 1.

Figure 9:
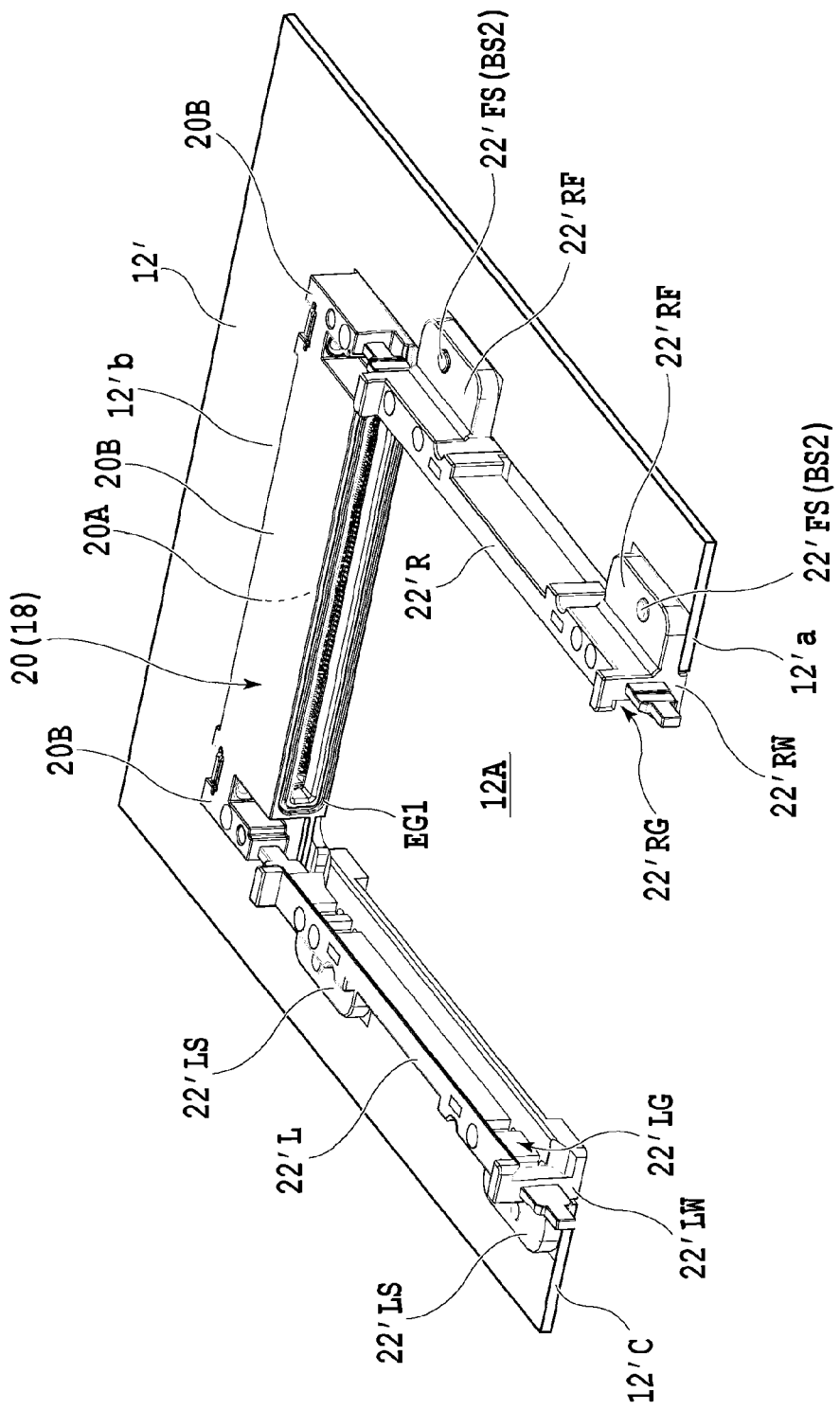
FIG. 9 is a perspective view showing a configuration of a second embodiment of a receptacle assembly according to the present invention.

FIG. 9 shows a second embodiment of a receptacle assembly according to the present invention.

In the example shown in FIG. 2, the receptacle assembly has the heat sink unit. On the other hand, in the example shown in FIG. 9, the receptacle assembly does not have a heat sink unit. It will be noted that the constituents in FIG. 9 which are the same as those in FIG. 2 are denoted by the same reference numerals and the overlapping description thereof will be omitted. It is to be also noted that the module 14 shown in FIG. 1 are made attachable to and detachable from the receptacle assembly shown in FIG. 9. The receptacle assembly is supported by the support panel 10 (see FIG. 2), though the illustration thereof is omitted in FIG. 9.

Although illustration of the receptacle assembly is omitted in FIG. 9, the receptacle assembly comprises the bracket 24 (see FIG. 4) which guides the module 14 when the module 14 is attached or detached; the pair of guide rail members 22R and 22L constituting the accommodation portion which detachably accommodates the module 14 through the bracket 24; the host connector 18 which electrically connects the contact pads of the plug connector 14P of the attached module 14 and a conductive pattern of a printed wiring board 12'; and the connector cover 20 which covers the host connector 18 as a principal element.

The printed wiring board 12' has an opening 12'A provided at a central part thereof. The opening 12'A is formed be surrounded by guide rail placement portions 12'a and 12'c opposed to each other, and a connector support portion 12'b connecting end portions of the guide rail placement portions 12'a and 12'c.

Each of the guide rail placement portions 12'a and 12'c extends in the directions of attachment and detachment of the module 14.

Because the guide rail placement portion 12'a to support the guide rail member 22'R and the guide rail support portion 12'c to support the guide rail member 22'L have the same structure, the guide rail placement portion 12'a will be described below while omitting the description of the guide rail support portion 12'c. The guide rail placement portion 12'a has a plurality of holes provided at predetermined positions, into which the machine screws BS2 for fixing the guide rail member 22'R to the printed wiring board 12' are inserted. Herewith, the guide rail members 22'R and 22'L serving as the guide members are fixed to the guide rail placement portions 12'a and 12'c, respectively, by screwing the machine screws BS2 through female screw holes 22'FS via the aforementioned holes.

The host connector 18 is placed at the connector support portion 12'b which supports the connector cover 20 and the host connector 18. The connector support portion 12'b has a pair of holes provided at the two ends thereof and adjacent to the host connector 18, into which machine screws for fixing the connector cover 20 to the printed wiring board 12' are inserted.

The guide rail member 22'R as the guide member is molded of a resin material, for example. The guide rail member 22'R comprises: a guide wall portion 22'RW which guides and holds one of the side portions of the module 14; and flange portions 22'RF formed integrally with the guide wall portion 22'RW and fixed to the guide rail placement portion 12'a of the printed wiring board 12'.

Each flange portion 22'RF extends sideways in a direction substantially perpendicular to one of outer peripheral surfaces of the guide wall portion 22'RW and substantially parallel to the guide rail placement portion 12'a. The flange portions 22'RF are provided with a plurality of female screw holes 22'FS at a predetermined interval corresponding to the holes in the printed wiring board 12'.

A proximal end of the flange portion 22'RF is connected to the guide wall portion 22'RW at a position some distance from a lower end position of the guide wall position 22'RW toward an upper end of the guide wall portion 22'RW, e.g. a position away by a predetermine height greater than a plate thickness of the printed wiring board 12'. Hereby, the lower end of the guide wall portion 22'RW penetrates the opening 12'A toward the support panel 10 and projects downward from the printed wiring board 12'. At that time, the lower end of the guide wall portion 22'RW is located on the common plane with the end portion of the connector cover 20 projecting to the opening 12'A. Accordingly, a back surface of the printed wiring board 12' and the periphery of the slot of the connector cover 20 corresponding thereto are located substantially on the common plane.

The above-described engagement portion of the guide rail support portion 20B and the protrusion to be engaged with one of engagement portions of the bracket 24 are provided to each of the two ends in the longitudinal direction of the guide wall portion 22'RW.

A guide groove 22'RG which guides and holds one of the side portions of the module 14 is formed in the longitudinal direction on the other outer peripheral surface of the guide wall portion 22'RW.

In the meantime, the guide rail member 22'L as the other guide member is molded of a resin material, for example. The guide rail member 22'L has: a guide wall portion 22'LW which guides and holds the other one of the side portions of the module 14; and flange portions 22'LS formed integrally with the guide wall portion 22'LW and fixed to the guide rail placement portion 12'c of the printed wiring board 12'. Because the configurations of the guide wall portion 22'LW and the flange portions 22'LS are the same as those of the guide wall portion 22'RW and the flange portions 22'RF described above, respectively, and the explanation thereof will be omitted.

As a consequence, because the position of the slot of the connector cover 20 is set to a position closer to the mounting surface of the printed wiring board 12 in this embodiment as well, it is possible to achieve a low-profile styling of the receptacle assembly.

Figure 10:
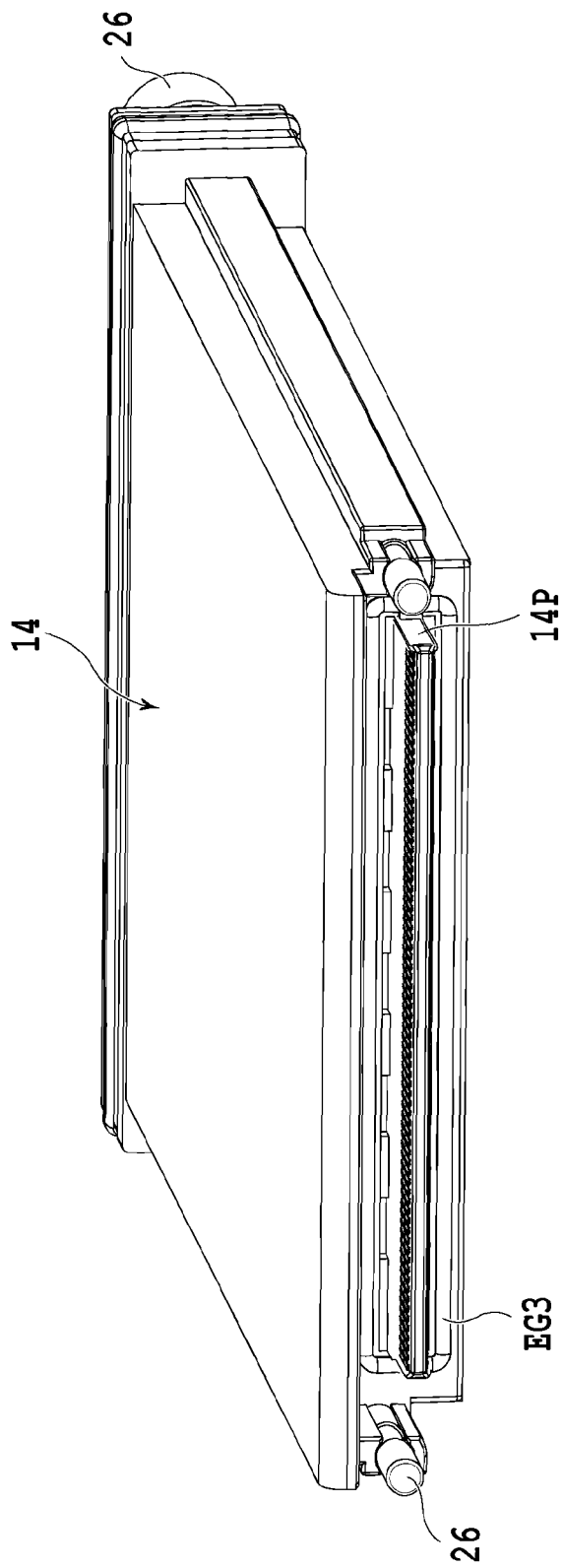
FIG. 10 is a perspective view showing another example of a module used in a modified example of the first embodiment of a module assembly according to the present invention.

FIG. 10 shows another example of a module used in an example of a module assembly according to the present invention.

In the example shown in FIG. 1, the annular EMI gasket EG1 as the first EMI gasket is provided around the periphery of the slot of the connector cover 20. Instead, in the example shown in FIG. 10, an annular EMI gasket EG3 is provided in such a way as to surround an outer peripheral portion of the plug connector 14P of the module 14 without providing the annular EMI gasket EG1 around the periphery of the slot of the connector cover 20. As a consequence, because when the plug connector 14P of the module 14 is connected to the host connector 18, the EMI gasket EG3 of the module 14, from which the plug connector 14P projects, comes into contact with an end surface on the periphery of the slot 20A of the connector cover 20 and the EMI gasket EG2 is in contact with the end of the connector support portion 12b of the printed wiring board 12 forming the opening 12A, noise generated in the host connector 18 is confined to the inside of the connector accommodation portion 20A.

Figure 11:
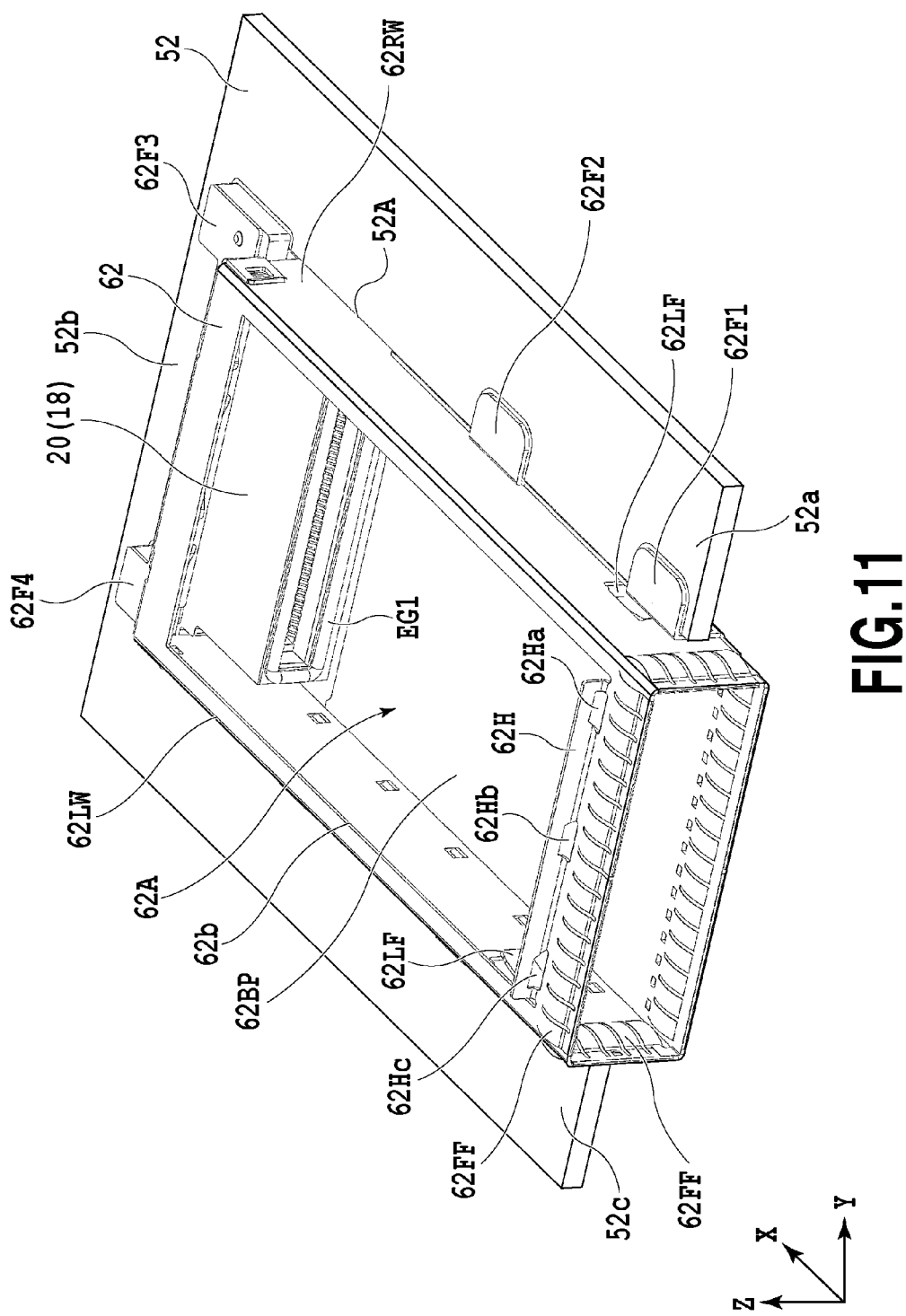
FIG. 11 is a perspective view showing a third embodiment of a receptacle assembly according to the present invention.

FIG. 11 shows a third embodiment of a receptacle assembly according to the present invention.

FIG. 11 shows an another example of a receptacle cage constituting part of the module assembly according to the present invention. It will be noted that the constituents in FIG. 11 which are the same as those of the example shown in FIG. 4 are denoted by the same reference numerals and the overlapping description thereof will be omitted.

The receptacle assembly comprises, as its main components: a receptacle cage 62 which is provided to a printed wiring board 52 and detachably accommodates the optical module 14; the host connector 18 to be accommodated by a receptacle connector accommodation portion of the receptacle cage 62; and the connector cover 20 provided with a connector accommodation portion which individually accommodates the host connector 18.

The printed wiring board 52 has an opening 52A provided at a central part thereof. The opening 52A is formed to be surrounded by flange portion placement portions 52a and 52c opposed to each other, and a connector support portion 52b connecting end portions of the flange portion placement portions 52a and 52c.

The receptacle cage 62 is formed out of a thin sheet of stainless steel or phosphor bronze, for example, or preferably by conducting presswork on stainless steel or phosphor bronze having good heat conductivity. The receptacle cage 62 is provided with a compartment 62A comprising a module accommodation portion and a receptacle connector accommodation portion therein.

It should be understood that the receptacle cage 62 is not limited to the above-described example but, a plurality of compartments 62A may be formed in parallel along a Y-coordinate axis extending in an orthogonal direction to an X-coordinate axis, which is the directions of attachment and detachment of the module 14 in terms of the orthogonal coordinates in FIG. 11.

The module accommodation portion in the compartment 62A is formed so as to be surrounded by side walls 62RW and 62LW opposed to each other with a predetermined interval in between, and a bottom wall portion 62BP thereof. The side walls 62RW and 62LW serving as the guide members to guide the module 14 extend in the X-coordinate axis in FIG. 11, i.e., the directions of attachment and detachment of the module 14. Each of the side walls 62RW and 62LW may also have a attachment piece 62LF located in the vicinity of a module slot and configured to establish a locked state of the module 14 with the module accommodation portion.

Each of side walls 62RW and 62LW has flange portions 62F1 and 62F2 to be engaged with the flange portion placement portions 52a and 52c of the printed wiring board 52, respectively. The flange portions 62F1 and 62F2 are separated from each other with a predetermined interval in between in the X-coordinate axis. In addition, a back plate of the receptacle cage 62 has flange portions 62F3 and 62F4 to be fixed to the connector support portion 52b of the printed wiring board 52. The flange portions 62F3 and 62F4 are separated from each other with a predetermined interval in between in the Y-coordinate axis. The flange portions 62F3 and 62F4 are fixed to the connector support portion 52b by screwing machine screws through female screw parts of the flange portions 62F3 and 62F4 via holes in the printed wiring board 52.

Proximal ends of the flange portions 62F1, 62F2, 62F3, and 62F4 are connected to the side walls 62RW and 62LW and the back plate at positions some distance from a lower end position of the side walls 62RW and 62LW and the back plate toward an upper end of the side walls 62RW and 62LW and the back plate, e.g. a position away by a predetermine height greater than a plate thickness of the printed wiring board 52. Hereby, the lower ends of the side walls 62RW and 62LW and the back plate penetrate the opening 52A and project downward from the printed wiring board 52.

At that time, the lower ends of the side walls 62RW and 62LW and the back plate are located on the common plane with the end portion of the connector cover 20 projecting to the opening 52A. Accordingly, a back surface of the printed wiring board 52 and the periphery of the slot of the connector cover 20 corresponding thereto are located substantially on the common plane. In other words, because the position of the slot of the connector cover 20 is set to a position closer to the mounting surface of the printed wiring board 52, it is possible to achieve a low-profile styling of the receptacle assembly.

The module accommodation portion has the module slot on one end, which is opened in the direction of the X-coordinate axis. Herewith, the module 14 is attached and detached via the module slot. A tubular front EMI finger 62FF is provided on the entire periphery of the module slot which has a substantially rectangular cross section. An inner peripheral portion of the front EMI finger 62FF comes into contact with an outer peripheral portion of the inserted module 14. In addition, an outer peripheral portion of the front EMI finger 62FF comes into contact, for example, with the periphery of an opening of a front panel of a housing where the receptacle cage 62 is provided.

Hereby, because when the receptacle cage 62 is press-fitted into the opening of the housing, a gap between the opening of the housing and the outer peripheral portion of the receptacle cage 62 is shielded by the front EMI finger 62FF made of metal, noise is confined to the inside of the above-described housing, and there is no danger of leakage of the noise to the outside through a gap between the outer peripheral portion of the module 14 and the inner peripheral portion of the module accommodation portion.

In addition, the other end of the module accommodation portion opposed to the module slot communicates with the inside of the receptacle connector accommodation portion. An opening 62b opened in a Z-coordinate axis is formed at a portion of the receptacle cage 62 opposed to the bottom wall portion thereof. On the periphery of the opening 62b, there is provided a heat sink support member 62H which detachably supports a heat sink (not shown) through a heat sink holder (not shown), for example. Attachment pieces formed on one end of the heat sink holder are inserted into holes 62Ha, 62Hb, and 62Hc of the heat sink support member 62H. An attachment piece to be attached with a nib portion that projects outward from the back plate of the receptacle cage 62 is formed on the other end of the heat sink holder.

Figure 12:
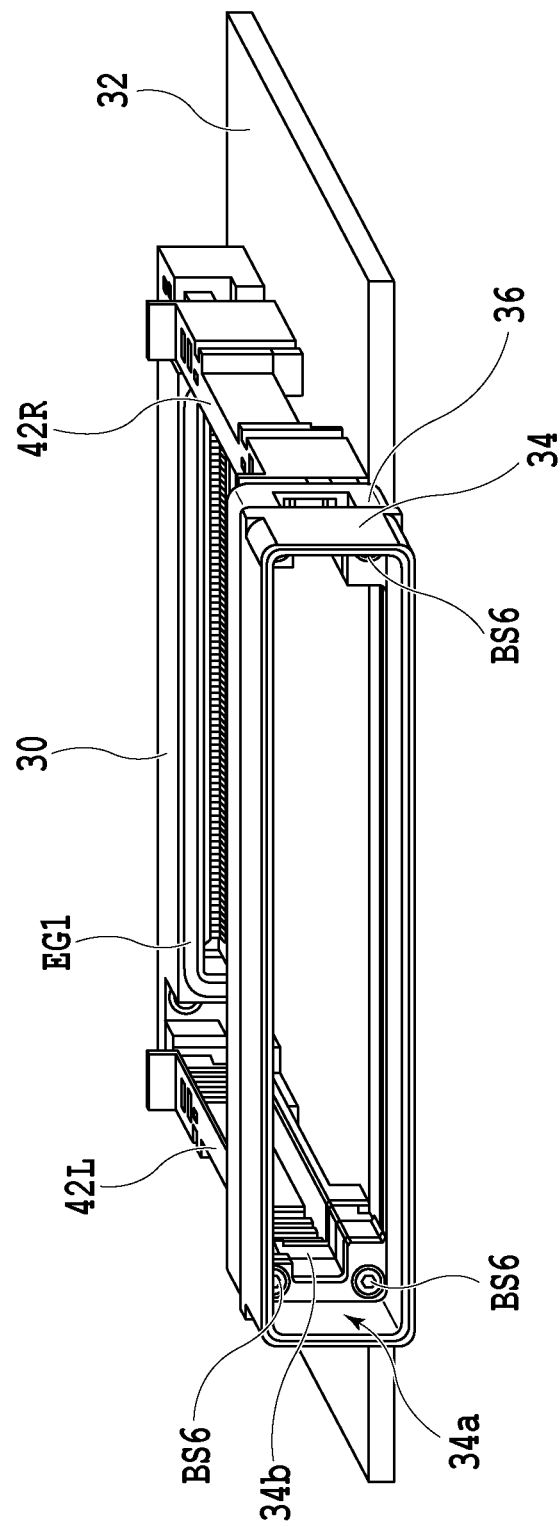
FIG. 12 is a perspective view showing a configuration of a fourth embodiment of a receptacle assembly according to the present invention.
Figure 13:
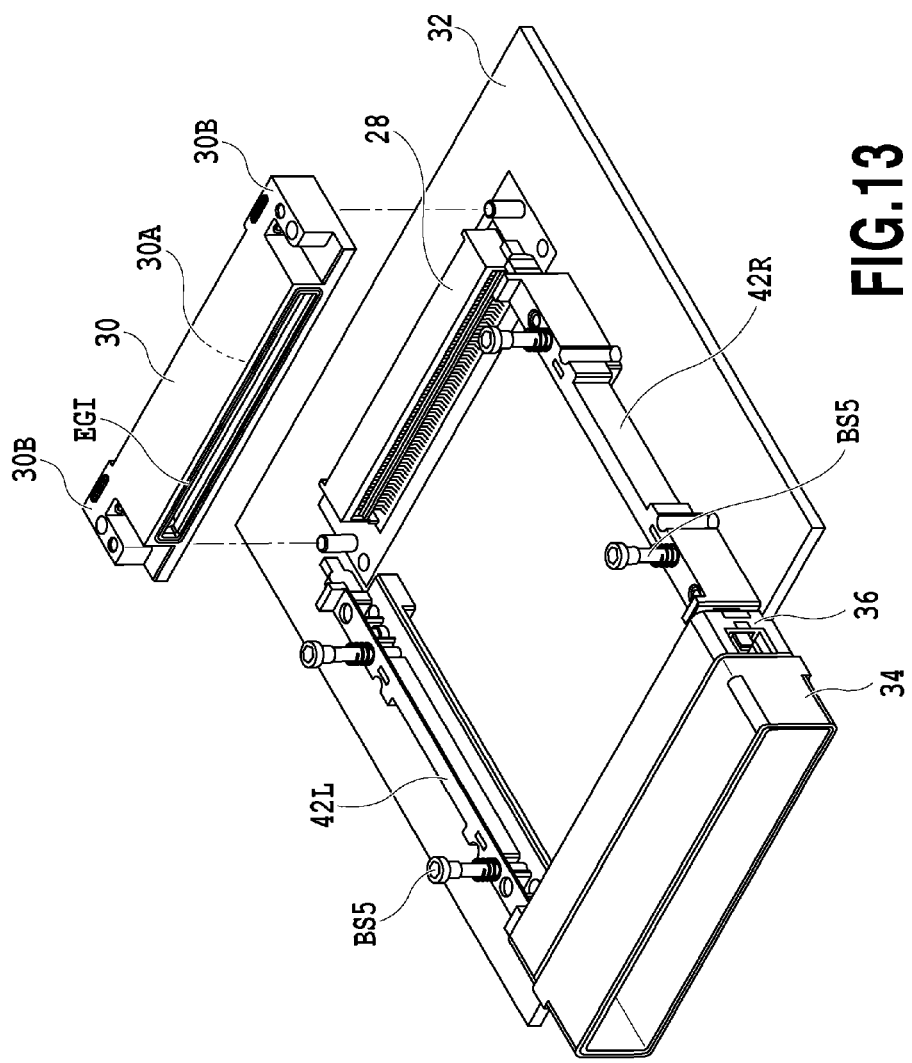
FIG. 13 is an exploded perspective view showing the configuration of the fourth embodiment of the receptacle assembly according to the present invention.

FIG. 12 and FIG. 13 show a fourth embodiment of a receptacle assembly according to the present invention.

A plurality of receptacle assemblies shown in FIG. 12 and FIG. 13 are arranged in parallel on a printed wiring board 32 in a certain electronic device. It will be noted that FIG. 12 and FIG. 13 show representatively one receptacle assembly supported by the printed wiring board 32.

Figure 14:
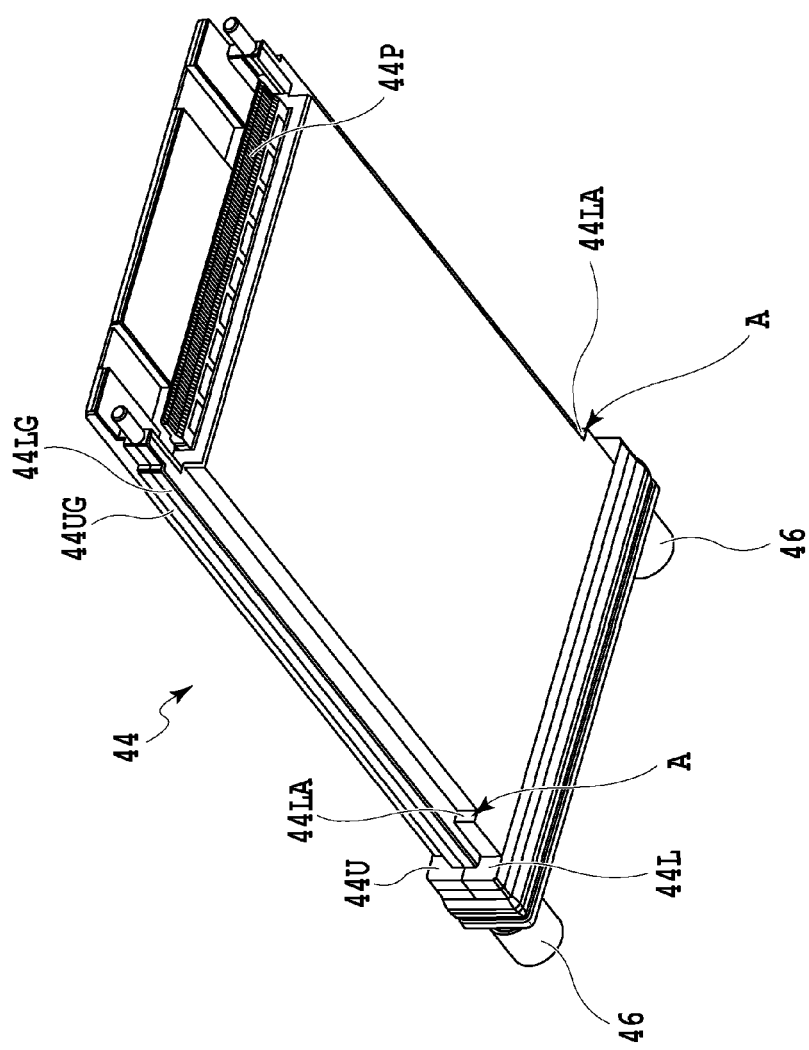
FIG. 14 is a perspective view showing a module used in the fourth embodiment of a module assembly according to the present invention.

As shown in FIG. 14, a module 44 comprises, as its main components, an upper case 44U and a lower case 44L made of metal and constituting a contour portion, and a module board to be positioned at a predetermined position in an accommodation space defined between the upper case 44U and the lower case 44L.

The upper case 44U as an upper member has an opened lower end. A thin sheet-shaped protection wall being continuous with an upper surface and the two side surfaces of the upper case and projecting in a longitudinal direction is formed at one end portion of the upper case 44U. The protection wall is provided for protecting a plug connector 44P to be described later in case the module 44 is dropped by mistake.

The module board has an electrode unit which is provided on one end thereof and constitutes the plug connector 44P serving as a connecting end portion. A plurality of contact pads are arranged in parallel to one another at predetermined intervals on common planes on top and bottom surfaces of the electrode unit which is formed at a tip end portion of the plug connector 44P.

The lower case 44L as a lower member is fixed to a lower end of the upper case 44U in such a way as to cover the opening at the lower end of the upper case 44U described above.

Although the above-described module board has the plug connector 44P as the connecting end portion, the module board is not so limited but may has a card edge terminal, for instance, instead of the plug connector, as the connecting end portion at its tip end portion.

An optical connector connected to an end of an optical cable (not shown) is connected to a port (not shown) provided at an end portion of the module 44. The other end of the optical cable is connected to an optical connector of another housing constituting a not-illustrated communication system. It will be noted that the port of the module is not so limited but may be designed to connect a coaxial connector which is connected to a coaxial cable, for instance.

Fixing screws 46 for fixing the module 44 to a connector cover 30 to be described later longitudinally penetrate through-holes, respectively, which are formed at the two side portions of the upper case 44U. A knob of each fixing screw 46 is exposed on the end surface of the module 44 where the port is opened. A male screw part to be threadedly engaged with a female screw part of the connector cover 30 is formed at a tip end of each fixing screw 46.

Protruding wall portions 44UG and 44LG projecting sideways are formed at the two side portions of the upper case 44U and the lower case 44L, respectively. The protruding wall portions 44UG and 44LG are adapted to come into slidable contact with the periphery of a second recessed portion 34R2 of a bracket 34 to be described later. In addition, contact surface portions 44LA are formed at end portions of the protruding wall portions 44LG of the lower case 44 located near the knobs of the fixing screws 46. When the module 44 is connected to the receptacle assembly, portions A of the contact surface portions 44LA of the lower case 44L are adapted to come into contact with portions A (see FIG. 15A) forming the periphery at the two ends of a first recessed portion 34R1 of the bracket 34 to be described later.

As shown in FIG. 13, the receptacle assembly is secured by the printed wiring board 32. The receptacle assembly comprises, as its main components: the bracket 34 which guides the module 44 when the module 44 is attached or detached; a bracket support member 36 to which the bracket 34 is connected; a pair of guide rail members 42R and 42L constituting an accommodation portion which detachably accommodates the module 44; a heat sink unit (not shown) which dissipates heat generated from the module 44; a host connector 28 which electrically connects the contact pads of the plug connector 44P of the attached module 44 and a conductive pattern of the printed wiring board 32; and the connector cover 30 which covers the host connector 28.

As shown in FIG. 12, the bracket 34 has a guide slot provided at a central part in such a way as to penetrate the bracket along its short sides. The guide slot is comprised of: a first hole portion 34a which allows insertion of the end portion of the module 44 where the knobs of the fixing screws 46 described above are exposed; and a second hole portion 34b which communicates with the substantially rectangular first hole portion 34a and has guide walls.

Figure 15A:

As shown in FIG. 15A, the second hole portion 34b is formed of the first recessed portion 34R1, the second recessed portion 34R2, and a third recessed portion 34R3. The first recessed portion 34R1 is formed to correspond to a lower end portion continuous with the protruding wall portions 44LG of the lower case 44L of the module 44 described above. A width dimension Lb of the first recessed portion 34R1 is set slightly larger than a width dimension of the lower end portion of the module corresponding thereto.

The second recessed portion 34R2 is formed to correspond to the protruding wall portions 44UG and 44LG of the upper case 44U and the lower case 44L of the module 44. The protruding wall portions 44UG and 44LG of the module 14 passing through the second recessed portion 34R2 come into slidable contact with the periphery of the second recessed portion 34R2. The third recessed portion 34R3 is formed to correspond to an upper end portion which is continuous with the protruding wall portions 44UG of the upper case 44U of the module 44 described above. A width dimension of the third recessed portion 34R3 is set larger than a width dimension La of the upper end portion of the module corresponding thereto. Through-holes into which machine screws BS6 for fixing the bracket 34 to the bracket support member 36 are inserted are formed at four positions around the second hole portion 34b.

The bracket support member 36 has a guide slot inside, which corresponds to the second hole portion 34b of the bracket 34.

A pair of holes into which machine screws for fixing the connector cover 30 to the printed wiring board 32 are inserted, and positioning pins are provided to the printed wiring board 32 at its two ends adjacent to the host connector 28. The host connector 28 is provided between the positioning pins.

The host connector 28 comprises a connector insulator having a slot into which the plug connector 44P of the module 44 is detachably inserted, and a plurality of contact terminals (not shown). The each contact terminal is provided to electrically connect the plug connector 44P of the module 44 to a group of electrodes connected to the conductive pattern of the printed wiring board 32.

For example, a plurality of slits formed at predetermined intervals in the longitudinal direction are provided on the periphery of the slot of the connector insulator molded out of a resin material. The adjacent slits are separated from one another by partition walls. In each slit, a movable contact portion of one of the contact terminals and a movable contact portion of another one of the contact terminal are disposed opposite to each other. Fixing terminals of the contact terminals of the host connector 28 are soldered to the conductive pattern of the printed wiring board 32. The host connector 28 is covered with the connector cover 30.

The connector cover 30 is made of a metal material, for example. As shown in FIG. 13, the connector cover 30 comprises a connector accommodation portion 30A, and guide rail support portions 30B formed on the two sides of the connector accommodation portion 30A and designed to support ends of the guide rail members 42R and 42L to be described later.

The connector accommodation portion 30A is provided with a slot to allow passage of the plug connector 44P of the module 44 when the module 44 is attached or detached, and configured to receive the host connector 28 inside and to cover the host connector 28 while retaining given clearances.

The slot of the connector accommodation portion 30A is formed to face the slot of the host connector 28 described above. Female screw parts into which the above-described male screw parts of the fixing screws 46 are screwed are formed at two positions near two ends on the periphery of the slot of the connector accommodation portion 30A. In addition, a groove into which the annular EMI gasket EG1 is inserted is formed around the periphery of the slot. Moreover, a groove into which another annular EMI gasket (not shown) is inserted is formed in a lower end surface of the connector cover 30. The EMI gasket at the bottom part comes into contact with a mounting surface of the printed wiring board 32.

Hereby, because when the plug connector 44P of the module 44 is connected to the host connector 28, an end surface of the module 44 from which the plug connector 44P projects comes into contact with the EMI gasket EG1 on the periphery of the slot of the connector cover 30, and the EMI gasket at the bottom part comes into contact with the mounting surface of the printed wiring board 32, noise generated in the host connector 28 is confined to the inside of the connector accommodation portion 30A.

An engagement portion (not shown), with which one end of the corresponding one of the guide rail members 42R and 42L comes into engagement, is provided at a position adjacent to a female screw part of each of the guide rail support portions 30B. In addition, female screw holes (not shown) into which machine screws are threaded via the holes in the printed wiring board 32 are formed inside the guide rail support portions 30B in a substantially perpendicular direction to the mounting surface of the printed wiring board 32.

The guide rail member 42R is formed from a resin material, for example. As shown in FIG. 13, the guide rail member 42R includes a guide wall portion which guides and holds one of the side portions of the module 44.

The guide wall portion includes protrusions which are formed on two ends in the longitudinal direction and are to be engaged with the above-described engagement portion of the corresponding guide rail support portion 30B and an engagement portion of a bracket support portion 36, respectively.

A guide groove which guides and holds one of the side portions of the module 44 is formed in the longitudinal direction on one of outer peripheral surfaces of the guide wall portion.

Female screw holes are formed at two positions of an upper part of the guide wall portion. Machine screws BS5 for fixing a heat sink body (not shown) to the guide rail member 42R are threaded into the female screw holes. Protrusions for positioning the heat sink body with respect to the guide rail member 42R are formed at positions adjacent to the female screw holes. Tip end portions of the protrusions are engaged with relatively shallow positioning grooves of the heat sink body (not shown), respectively.

In the meantime, the guide rail member 42L is formed from a resin material, for example. As shown in FIG. 13, the guide rail member 42L includes a guide wall portion which guides and holds the other one of the side portions of the module 44. The configuration of the guide wall portion is the same as the configuration of the guide wall portion of the guide rail member 42R described above, and the explanation thereof will be omitted. Accordingly, the module accommodation portion is defined on the printed wiring board 32 and between the guide rail member 42R and the guide rail member 42L.

Figure 15B:
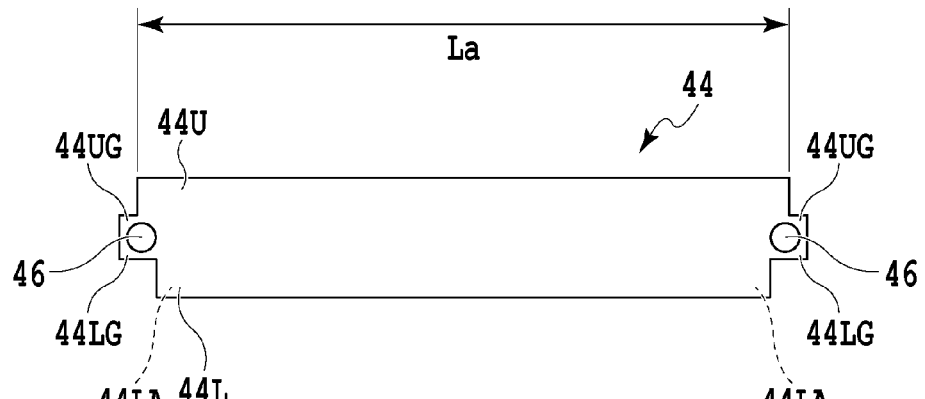
FIG. 15B and FIG. 15C are views each showing an outline of a cross section of a module used with the bracket.

In the above-described configuration, when the plug connector 44P of the module 44 is connected to the host connector 28, if the module 44 is inserted through the guide slot of the bracket 34 and the guide slot of the bracket support portion 36 in the state where the upper end portion of the upper case 44U of the module 44 is aligned with the third recessed portion 34R3 of the bracket 34 as shown in FIG. 15B, the module 44 is guided by the guide rails 42R and 42L and held inside the above-described module accommodation portion.

Figure 15C:
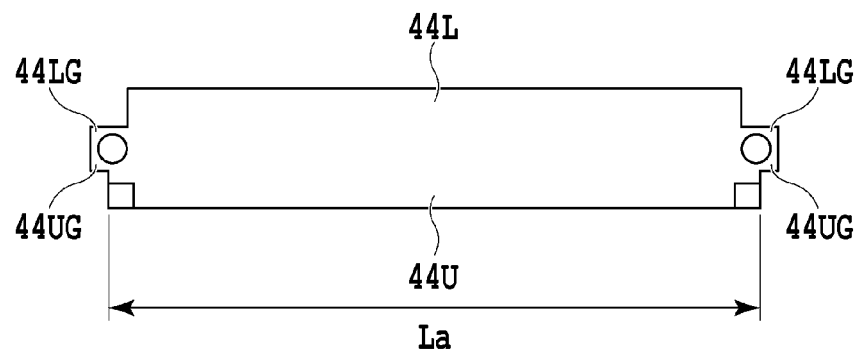

On the other hand, as shown in FIG. 15C, when the module 44 is inserted into the guide slot of the bracket 34 and the guide slot of the bracket support portion 36 in the state where the lower case 44L of the module 44 is incorrectly aligned with the third recessed portion 34R3 of the bracket 34, i.e., in the state where the module 44 is placed upside down, the end surface of the upper case 44U comes into contact with the portions A shown in FIG. 15A since the width dimension La of the upper case 44U of the module 44 is larger than the width dimension Lb of the first recessed portion 34R1 of the bracket 34. Thus, the module 44 in the incorrect position is prevented from being inserted into the bracket 34.

The configuration to avoid insertion of the incorrectly oriented module 44 into the bracket 34 is not limited only to the above-described example. For instance, as shown in FIGS. 16A and 16B, it is also possible to adopt a configuration in which engagement pieces 54K1 and 54K2 are formed on the periphery of a third recessed portion 54R3 of a bracket 54, and grooves 64D1 and 64D2 corresponding to the engagement pieces 54K1 and 54K2 are formed on an upper end portion of an upper case 64U of a module 64.

The bracket 54 includes a guide slot provided at a central part in such a way as to penetrate the bracket along its short sides. The guide slot is formed from: a first hole portion which allows insertion of an end portion of the module 64 where the knobs of the fixing screws 46 described above are exposed; and a second hole portion 54b which communicates with the substantially rectangular first hole portion and includes guide walls.

Figure 16A:
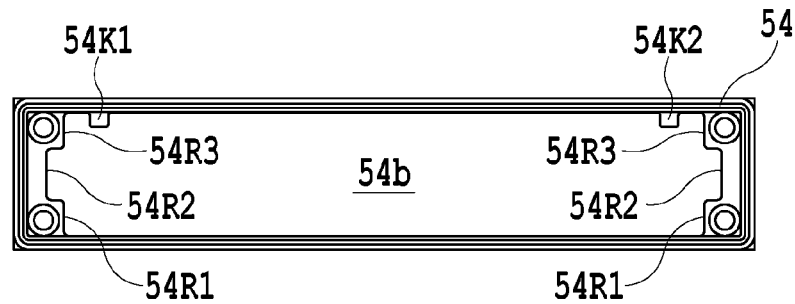
Figure 16B:
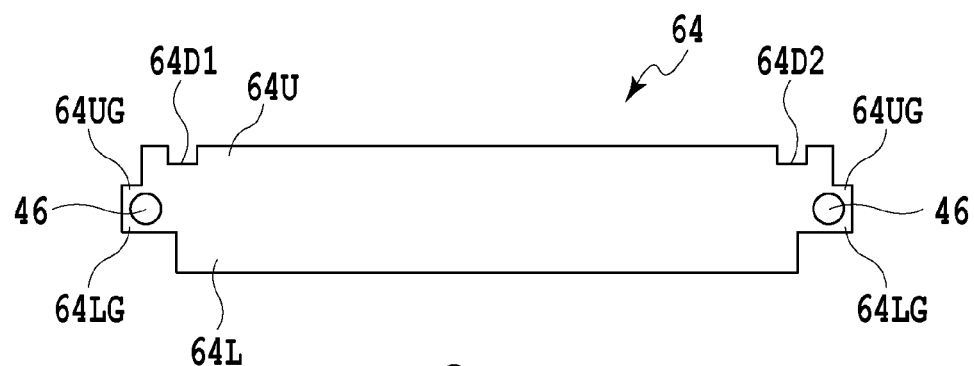
FIG. 16B and FIG. 16C are views each showing an outline of a cross section of a module used with the bracket.

As shown in FIG. 16A, the second hole portion 54b is formed from a first recessed portion 54R1, a second recessed portion 54R2, and the third recessed portion 54R3. The first recessed portion 54R1 is formed to correspond to a lower end portion continuous with protruding wall portions 64LG of a lower case 64L of the module 64 shown in FIG. 16B.

The second recessed portion 54R2 is formed to correspond to protruding wall portions 54UG and 54LG of the upper case 64U and the lower case 64L of the module 64. The protruding wall portions 64UG and 64LG of the module 64 passing through the second recessed portion 54R2 come into slidable contact with the periphery of the second recessed portion 54R2.

The third recessed portion 54R3 is formed to correspond to the upper end portion which is continuous with the protruding wall portions 64UG of the upper case 64U of the module 64 described above. The engagement pieces 54K1 and 54K2 are formed at a predetermined interval on the periphery of the third recessed portion 54R3. Through-holes into which the machine screws BS6 for fixing the bracket 54 to the bracket support member 36 are inserted are formed at four positions around the second hole portion 54b.

In the above-described configuration, when a plug connector of the module 64 is connected to the host connector 28, if the module 64 is inserted through the guide slot of the bracket 54 and the guide slot of the bracket support portion in the state where the grooves 64D1 and 64D2 at the upper end portion of the upper case 64U of the module 64 are aligned with the engagement pieces 54K1 and 54K2 at the third recessed portion 34R3 of the bracket 54 as shown in FIG. 16B, the module 64 is guided by the guide rails 42R and 42L and held inside the above-described module accommodation portion.

Figure 16C:
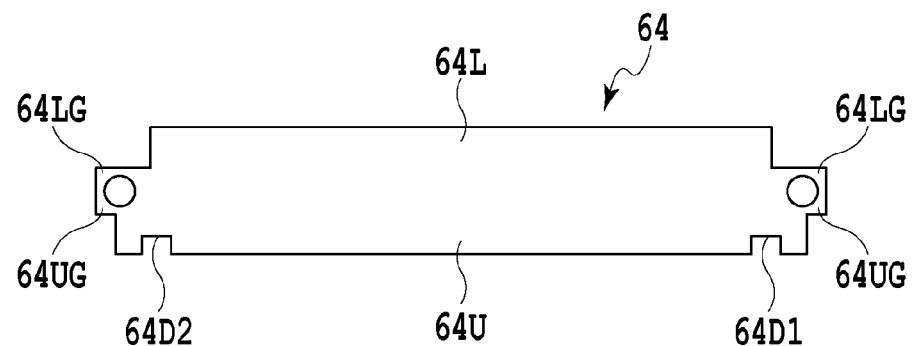

On the other hand, as shown in FIG. 16C, when the module 64 is inserted into the guide slot of the bracket 54 and the guide slot of the bracket support portion in the state where the lower case 64L of the module 64 is incorrectly aligned with the third recessed portion 54R3 of the bracket 54, i.e., in the state where the module 64 is placed upside down, the lower case 64L of the module 64 comes into contact with the engagement pieces 54K1 and 54K2 at the third recessed portion 34R3 of the bracket 54. Thus, the module 64 in the incorrect position is prevented from being inserted into the bracket 54.

Figure 17A:
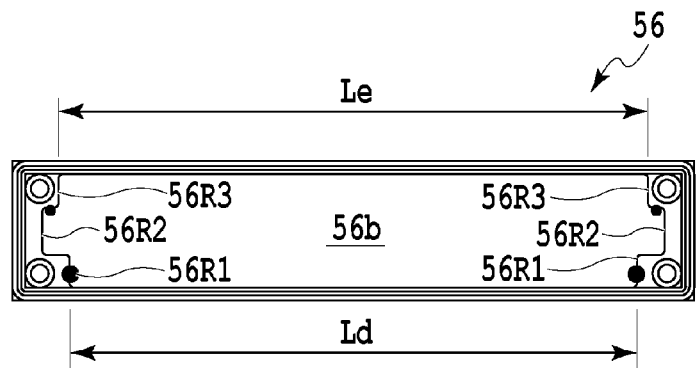
Figure 17B:
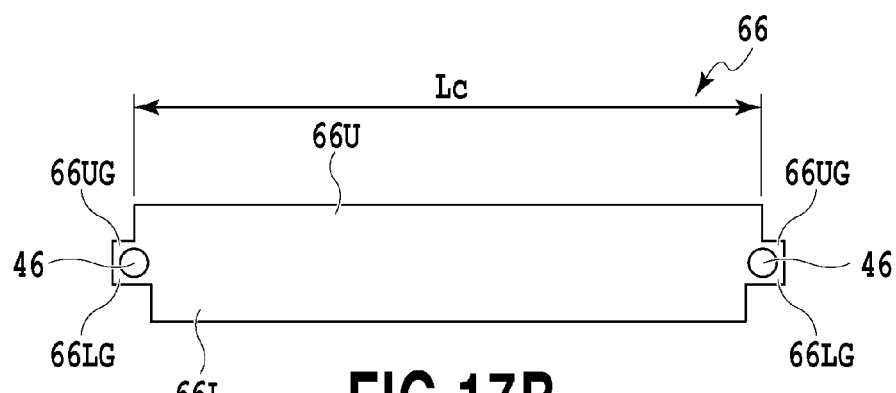
FIG. 17B and FIG. 17C are views each showing an outline of a cross section of a module used with the bracket.

In addition, as shown in FIGS. 17A and 17B, for example, a bracket 56 may be configured such that a ratio between a width dimension Le of its third recessed portion 56R3 and a width dimension Ld of its first recessed portion 56R1 is changed to a different value from that of the example shown in FIGS. 15A and 15B, while a module 66 may be configured such that a ratio between width dimensions of its upper case 66U and lower case 66L is changed likewise.

The bracket 56 includes a guide slot provided at a central part in such a way as to penetrate the bracket along its short sides. The guide slot is formed from: a first hole portion which allows insertion of an end portion of the module 66 where the knobs of the fixing screws 46 described above are exposed; and a second hole portion 56b which communicates with the substantially rectangular first hole portion and includes guide walls.

As shown in FIG. 17A, the second hole portion 56b is formed from the first recessed portion 56R1, a second recessed portion 56R2, and the third recessed portion 56R3. The first recessed portion 56R1 has a width dimension Ld, and is formed to correspond to a lower end portion continuous with protruding wall portions 66LG of the lower case 66L of the module 66 shown in FIG. 17B.

The second recessed portion 56R2 is formed to correspond to protruding wall portions 66UG and 66LG of the upper case 66U and the lower case 66L of the module 66. The protruding wall portions 66UG and 66LG of the module 66 passing through the second recessed portion 56R2 come into slidable contact with the periphery of the second recessed portion 56R2.

The third recessed portion 56R3 is formed to correspond to an upper end portion which is continuous with the protruding wall portions 66UG of the upper case 66U of the module 66 described above.

Through-holes into which the machine screws BS6 for fixing the bracket 56 to a bracket support member are inserted are formed at four positions around the second hole portion 56b.

In the above-described configuration, when a plug connector of the module 66 is connected to the host connector 28, if the module 66 is inserted through the guide slot of the bracket 56 and the guide slot of the bracket support portion in the state where the upper end portion of the upper case 66U of the module 66 is aligned with the third recessed portion 56R3 of the bracket 56 as shown in FIG. 17B, the module 66 is guided by the guide rails 42R and 42L and held inside the above-described module accommodation portion.

Figure 17C:
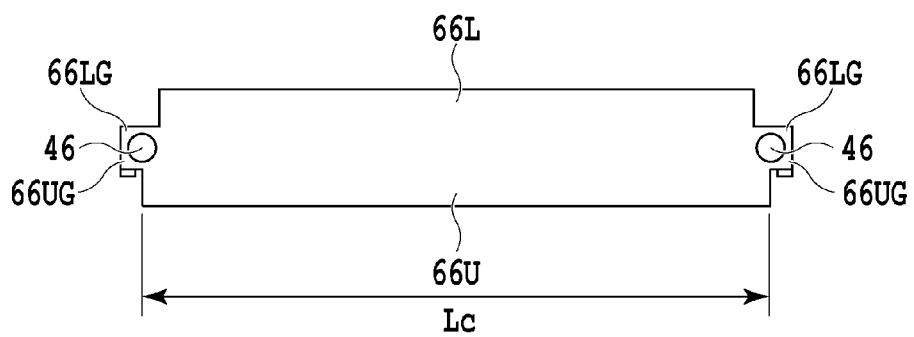

On the other hand, as shown in FIG. 17C, when the module 66 is inserted into the guide slot of the bracket 56 and the guide slot of the bracket support portion in the state where the lower case 66L of the module 66 is incorrectly aligned with the third recessed portion 56R3 of the bracket 56, i.e., in the state where the module 66 is placed upside down, the end surface of the upper case 66U comes into contact with the periphery of the first recessed portion 56R1 since the width dimension Lc of the upper case 66U of the module 66 is larger than the width dimension Ld of the first recessed portion 56R1 of the bracket 56. Thus, the module 66 in the incorrect position is prevented from being inserted into the bracket 56.

The configuration to avoid insertion of the incorrectly oriented module into the bracket is not limited only to the above-described examples. For instance, as shown in FIGS. 18A and 18B, it is also possible to adopt a configuration in which engagement pieces 58K1 and 58K2 are formed on the periphery of a third recessed portion 58R3 of a bracket 58, and grooves 68D1 and 68D2 as well as corner portions 68K1 and 68K2 corresponding to the engagement pieces 58K1 and 58K2 are formed at an upper end portion of an upper case 68U of a module 68.

The bracket 58 includes a guide slot provided at a central part in such a way as to penetrate the bracket along its short sides. The guide slot is formed from: a first hole portion which allows insertion of an end portion of the module 68 where the knobs of the fixing screws 46 described above are exposed; and a second hole portion 58b which communicates with the substantially rectangular first hole portion and includes guide walls.

Figure 18A:
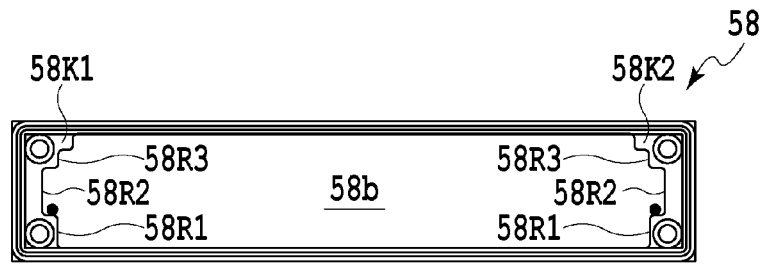
Figure 18B:
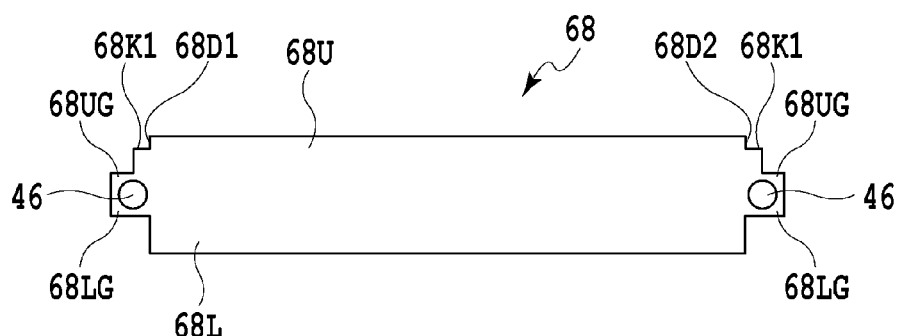
FIG. 18B and FIG. 18C are views each showing an outline of a cross section of a module used with the bracket.

As shown in FIG. 18A, the second hole portion 58b is formed from a first recessed portion 58R1, a second recessed portion 58R2, and the third recessed portion 58R3. The first recessed portion 58R1 is formed to correspond to a lower end portion continuous with protruding wall portions 68LG of a lower case 68L of the module 68 described above. The second recessed portion 58R2 is formed to correspond to protruding wall portions 68UG and 68LG of the upper case 68U and the lower case 68L of the module 68. The protruding wall portions 68UG and 68LG of the module 68 passing through the second recessed portion 58R2 come into slidable contact with the periphery of the second recessed portion 58R2.

The third recessed portion 58R3 is formed to correspond to the upper end portion which is continuous with the protruding wall portions 68UG of the upper case 68U of the module 68 described above. In addition, the engagement pieces 58K1 and 58K2 which correspond to grooves 68D1 and 64D2 of the upper case 68U are formed on the periphery of the third recessed portion 58R3.

Through-holes into which the machine screws BS6 for fixing the bracket 58 to a bracket support member are inserted are formed at four positions around the second hole portion 58b. The bracket support member includes a guide slot inside, which corresponds to the second hole portion 58b of the bracket 58.

In the above-described configuration, when a plug connector of the module 68 is connected to the host connector 28, if the module 68 is inserted through the guide slot of the bracket 58 and the guide slot of the bracket support portion in the state where the upper end portion of the upper case 68U of the module 68 is aligned with the third recessed portion 58R3 of the bracket 58 as shown in FIG. 18B, the module 68 is guided by the guide rails 42R and 42L and held inside the above-described module accommodation portion.

Figure 18C:
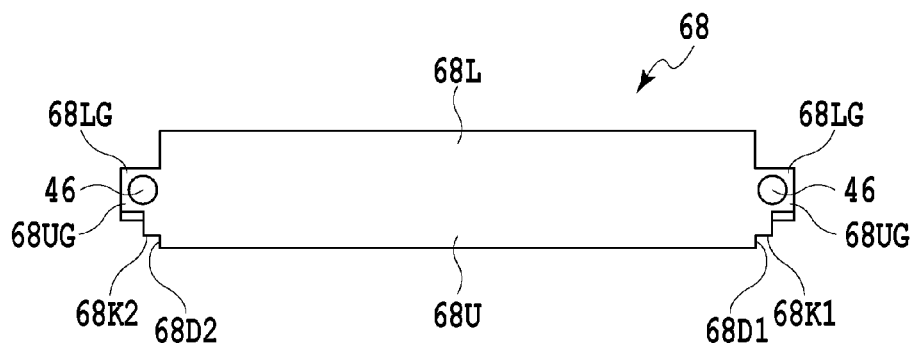

On the other hand, as shown in FIG. 18C, when the module 68 is inserted into the guide slot of the bracket 58 and the guide slot of the bracket support portion in the state where the lower case 68L of the module 68 is incorrectly aligned with the third recessed portion 58R3 of the bracket 58, i.e., in the state where the module 68 is placed upside down, the corner portions 68K1 and 68K2 of the upper case 68U of the module 68 come into contact with the periphery of the first recessed portion 58R1 of the bracket 58, whereby two ends of the lower case 68L of the module 68 come into contact with the engagement pieces 58K1 and 58K2 of the bracket 58. Thus, the module 68 in the incorrect position is prevented from being inserted into the bracket 58.

Figure 19A:
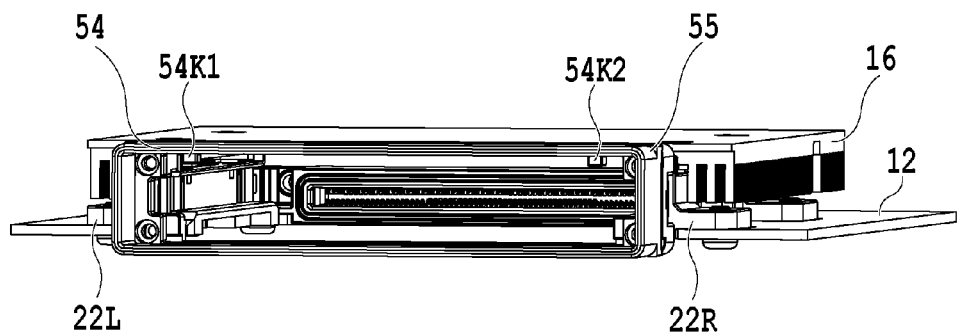
FIG. 19A and FIG. 19B are perspective views each showing a configuration of a fifth embodiment of a receptacle assembly according to the present invention.
Figure 19B:
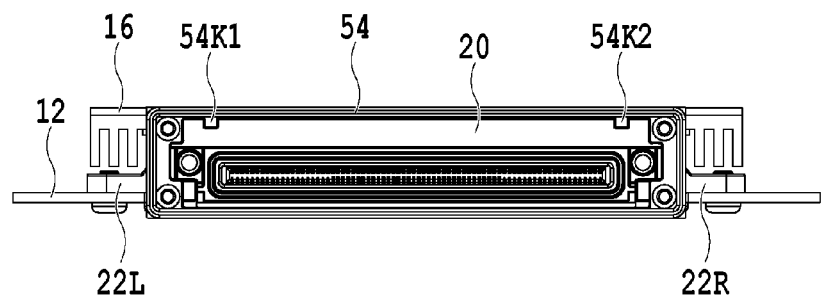

FIGS. 19A and 19B each shows a receptacle assembly according to a fifth embodiment of the present invention.

In the example shown in FIG. 2, the receptacle assembly includes the bracket 24 which guides the module 14. Instead, in the example shown in FIG. 19A, the receptacle assembly includes: the bracket 54 shown in FIG. 16A which guides the module 64; and a bracket support member 55 which supports the bracket 54. Note that the constituents in FIGS. 19A and 19B which are the same as those in the example shown in FIG. 2 are denoted by the same reference numerals and the overlapping description thereof will be omitted.

As shown in FIGS. 19A and 19B, the receptacle assembly includes, as its main components: the bracket 54 which guides the module 64 when the module 64 is attached or detached; the bracket support member 55 which supports the bracket 54; the pair of guide rail members 22R and 22L constituting the accommodation portion which detachably receives the module 64 through the bracket 54 and the bracket support member 55; the heat sink unit including the heat sink body 16 which dissipates the heat generated from the module 64; the host connector which electrically connects the contact pads of the plug connector of the attached module 64 and the conductive pattern of the printed wiring board 12; and the connector cover 20 which covers the host connector.

In the above-described configuration, when the heat sink unit is attached to the guide rail member 22R and the guide rail member 22L, the position of the slot of the connector cover 20 is set to a position closer to the mounting surface of the printed wiring board 12 as shown in FIG. 3. Moreover, since no fins are provided on the flat upper surface of the heat sink body 16, the height H from the mounting surface of the printed wiring board 12 to the flat upper surface of the heat sink body 16 is set to a relatively small value.

Moreover, when the plug connector of the module 64 is connected to the host connector, if the module 64 is inserted through the guide slot of the bracket 54 and the guide slot of the bracket support portion 36 in the state where the grooves 64D1 and 64D2 at the upper end portion of the upper case 64U of the module 64 are aligned with the engagement pieces 54K1 and 54K2 at the third recessed portion 34R3 of the bracket 54 as shown in FIG. 16B, the module 64 is guided by the guide rails 22R and 22L and held inside the above-described module accommodation portion.

On the other hand, as shown in FIG. 16C, when the module 64 is inserted into the guide slot of the bracket 54 and the guide slot of the bracket support portion 55 in the state where the lower case 64L of the module 64 is incorrectly aligned with the third recessed portion 34R3 of the bracket 54, i.e., in the state where the module 64 is placed upside down, the lower case 64L of the module 64 comes into contact with the engagement pieces 54K1 and 54K2 at the third recessed portion 54R3 of the bracket 54. Thus, the module 64 in the incorrect position is prevented from being inserted into the bracket 54.

Figure 20:
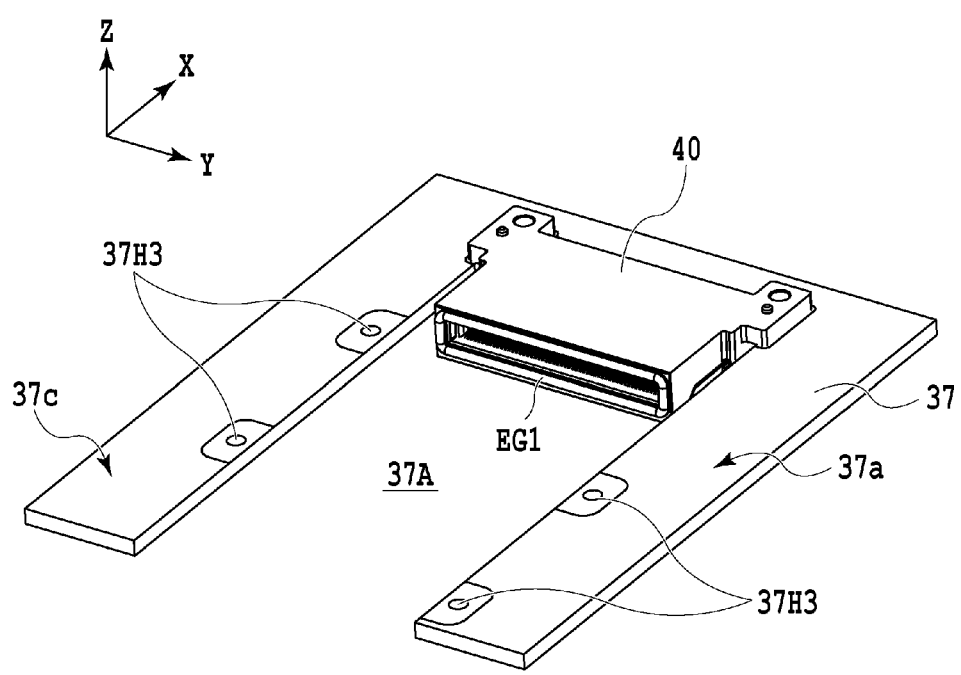
FIG. 20 is a perspective view showing another example of a connector cover used in the third embodiment of the receptacle assembly shown in FIG. 11 together with a printed wiring board.
Figure 21:
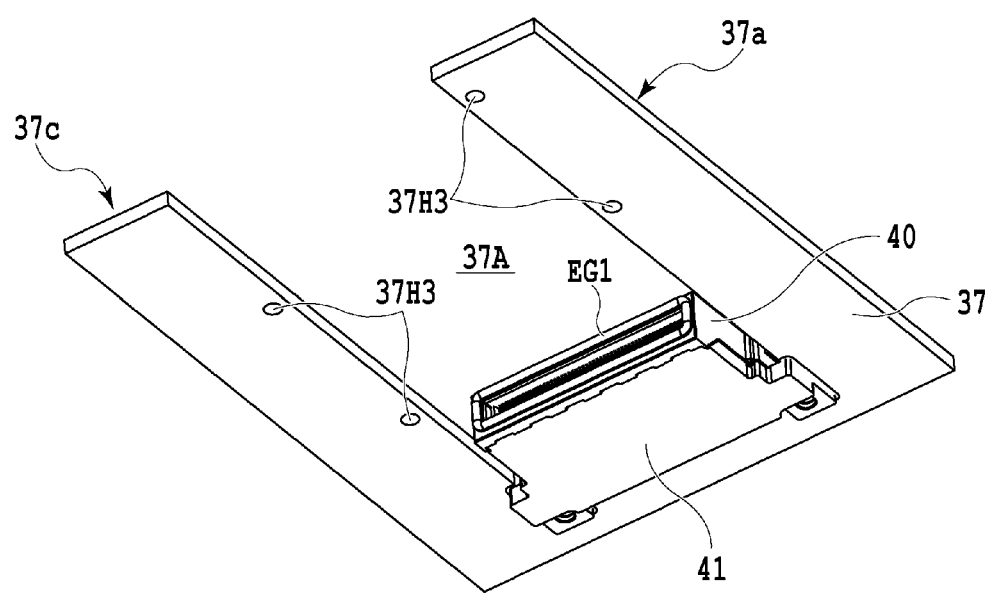
FIG. 21 is a perspective view showing another example of a connector cover used in the third embodiment of the receptacle assembly shown in FIG. 11 together with a printed wiring board.

FIGS. 20 and 21 each shows another example of a connector cover that covers a host connector used in the third embodiment of the receptacle assembly shown in FIG. 11 together with a printed wiring board.

The receptacle assembly comprises, as its main components: a receptacle cage which is provided to a printed wiring board 37 and detachably accommodates an optical module; a host connector 38 to be accommodated by a receptacle connector accommodation portion of the receptacle cage (see FIG. 24); and an upper cover 40 and a lower cover 41 constituting the connector cover provided with a connector accommodation portion which accommodates the host connector 38 to cover the host connector 38.

Because the structure of the above-described receptacle cage is the same as the structure of the receptacle cage shown in FIG. 11, its explanation will be omitted.

The printed wiring board 37 has an opening 37A provided at a central part thereof. The opening 37A is formed and surrounded by cage support portions 37a and 37c opposed to each other, and a connector support portion 37b connecting end portions of the cage support portions 37a and 37c. Each of the cage support portions 37a and 37c extends in the directions of attachment and detachment of a module, that is, extends along an X-coordinate axis shown in FIG. 20. Because the cage support portions 37a and 37c to support a flange portion of the receptacle cage have the same structure each other, the cage support portion 37a will be described below while omitting the description of the cage support portion 37c.

The cage support portion 37a has a plurality of holes 37H3 provided at predetermined positions, into which machine screws to be described later for fixing the flange portion of the receptacle cage to the printed wiring board 37 are inserted. Hereby, each flange portion of the receptacle cage is fixed to the cage support portion 37a by inserting the machine screws through the holes 37H3 and fastening them with nuts.

Figure 22:
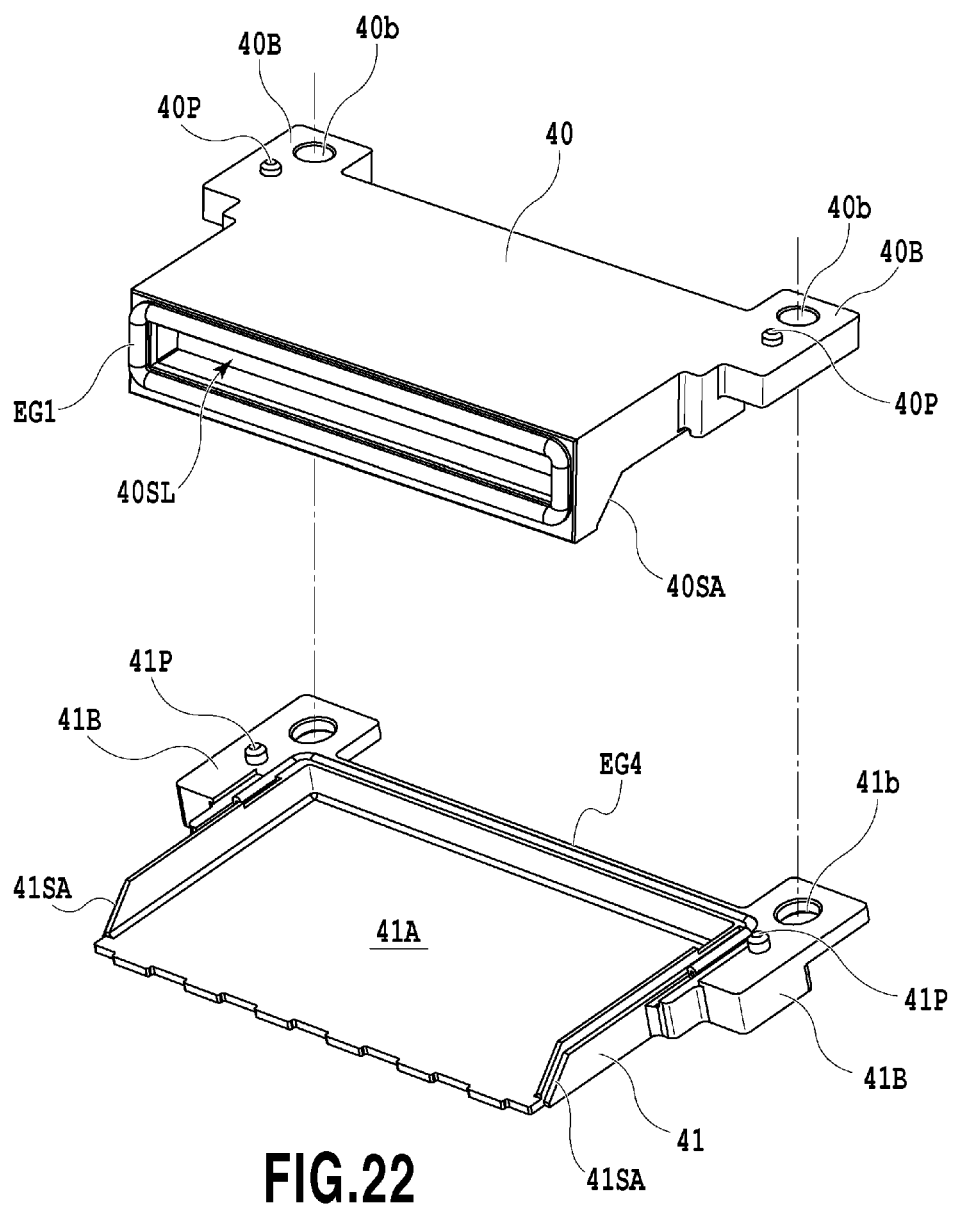
FIG. 22 is an exploded perspective view showing the connector cover used in the examples shown in FIGS. 20 and 21.
Figure 24:
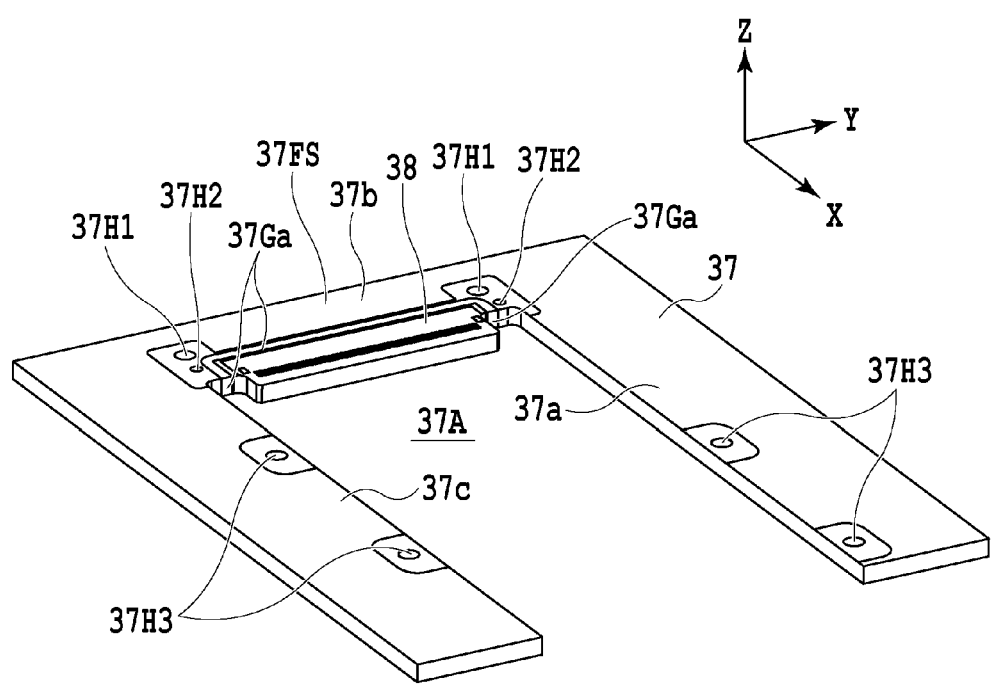
FIG. 24 is a perspective view showing another example of a host connector used in the third embodiment of the receptacle assembly shown in FIG. 11 together with the printed wiring board.

The connector support portion 37b orthogonal to the cage support portions 37a and 37c is configured to support the upper cover 40 and the lower cover 41 as shown in FIG. 22 and the host connector 38 shown in FIG. 24. The host connector 38 is fixed to the periphery of the connector support portion 37b that forms a part of the opening 37A. The connector support portion 37b has a pair of holes 37H1, provided at either sides of the host connector 38, into which the machine screws for fixing the upper cover 40 and the lower cover 41 to the printed wiring board 37 are inserted. Further, at positions adjacent to the pair of holes 37H1, protrusions 41P for positioning the lower cover 41 to be described later which are to be fitted with holes 37H2 are formed. The diameter of each of the holes 37H2 is set to be smaller than the diameter of each of the holes 37H1.

Figure 25:
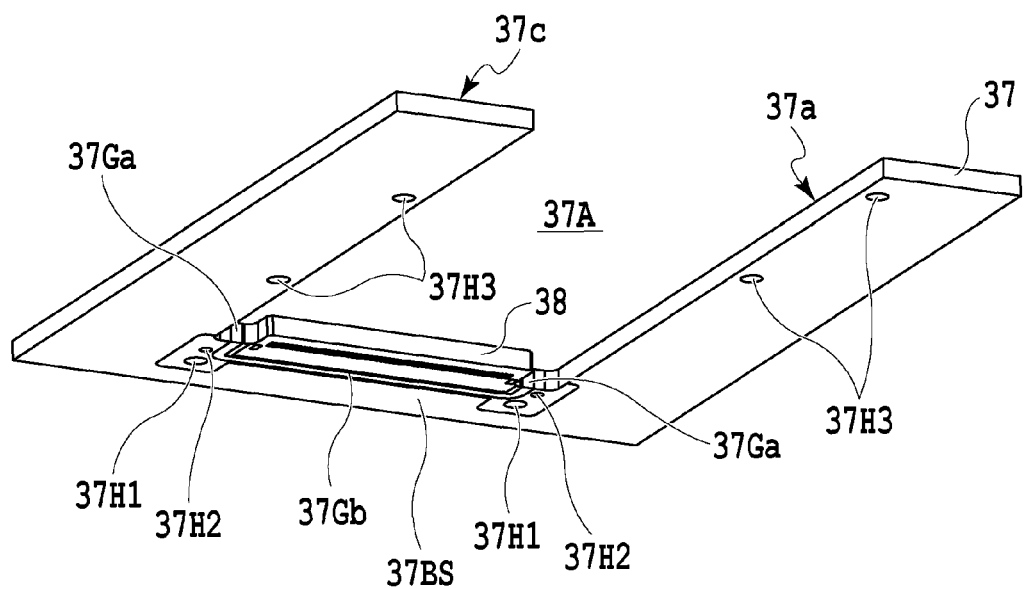
FIG. 25 is a perspective view showing another example of a host connector used in the third embodiment of the receptacle assembly shown in FIG. 11 together with the printed wiring board.

The host connector 38 comprises, as shown in FIGS. 24 and 25, a contact terminal group (not shown) which detachably comes into contact with the connecting end portion of the module. The contact terminal group is configured to electrically connect the connecting end portion of the module to a group of electrodes connected to a conductive pattern of the printed wiring board 37. A ground line contact pad 37Ga is formed on the periphery of the host connector 38 at a surface 37FS of the connector support portion 37b and an inner peripheral surface forming a part of the opening 37A. The ground line contact pad 37Ga is electrically connected to a ground line of the printed wiring board 37. In addition, a ground line contact pad 37Gb which is continuous with the ground line contact pad 37Ga is also formed on the periphery of the host connector 38 at a back side 37BS of the connector support portion 37b as shown in FIG. 25. The upper part and lower part of the host connector 38 are each covered by the connector cover comprising the upper cover 40 and the lower cover 41.

Figure 23:
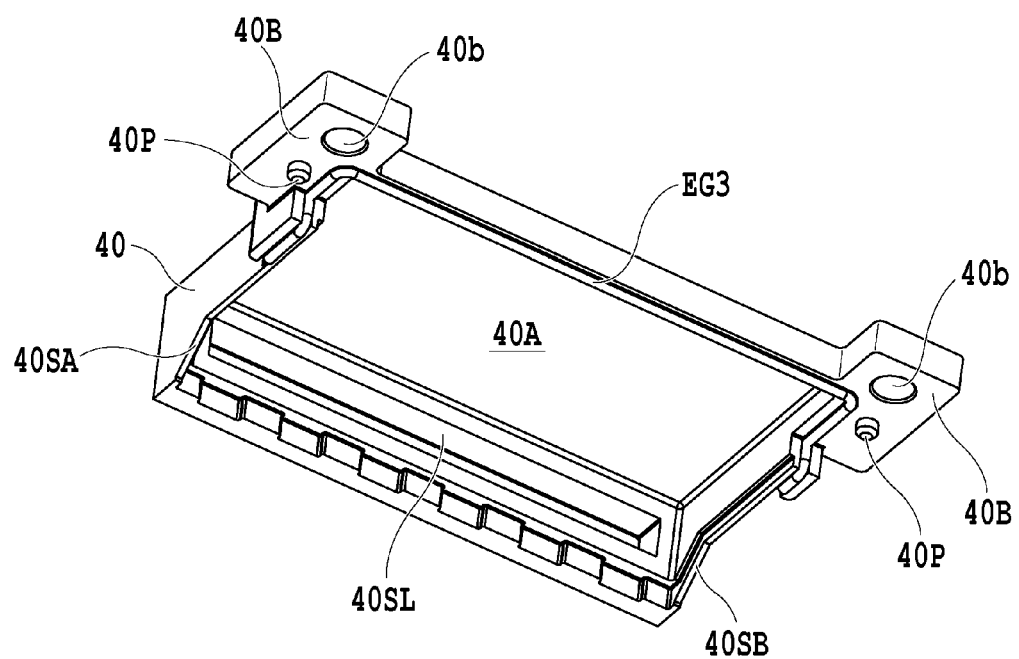
FIG. 23 is a perspective view showing the inside of an upper cover shown in FIG. 22.

The upper cover 40 is made of metal material, for example. As shown in FIGS. 22 and 23, the upper cover 40 comprises a connector accommodation portion 40A and fixation portions 40B each formed integrally on one end of the side walls forming the connector accommodation portion 40A. Each of the fixation portions 40B having a hole 40b is fixed to the above-described surface 37FS of the connector support portion 37b of the printed wiring board 37.

The upper cover 40 is configured to accommodate the host connector 38 inside and to cover the upper part of the host connector 38 while retaining given clearances. The connector accommodation portion 40A is formed and surrounded by a pair of side walls, a connecting wall having a slot 40SL that allows passage of the connecting end portion of the module and connecting the other end portions of the pair of side walls, and an upper wall which is continuous with the pair of side walls and the connecting wall and which forms the upper part of the upper cover 40. The slot 40SL in the connector accommodation portion 40A is formed so as to face the above-described host connector 38. An annular EMI gasket EG1 serving as a first EMI gasket is cemented to the periphery of outer peripheral edges of the slot 40SL. In addition, an EMI gasket EG3 serving as a third EMI gasket is cemented on an edge formed between the pair of the fixation portions 40B and portions directly under the fixation portions 40B continuous with the side walls at the connector accommodation portion 40A shown in FIG. 23. The EMI gasket EG1 is made of, for example, synthetic rubber material, and the EMI gasket EG3 and an EMI gasket EG4 serving as a fourth EMI gasket to be described later are made of, for example, conductive rubber material or conductive resin material. The EMI gasket EG3 is pressed to the above-described ground line contact pad 37Ga when the fixation portions 40B of the upper cover 40 are fixed on the surface 37FS of the connector support portion 37b. An inclined portion 40SA is formed at a position of each of the side walls of the upper cover 40 which is apart from the connector support portion 37b of the printed wiring board 37. The inclined portion 40SA is aligned and engaged with a corresponding inclined portion 41SA positioned at the lower cover 41 to be described later.

The lower cover 41 is made of metal material, for example. As shown in FIG. 22, the lower cover 41 comprises a connector accommodation portion 41A and fixation portions 41B each formed integrally on one end of the side walls forming the connector accommodation portion 41A. Each of the fixation portions 41B having a hole 41b is, as shown in FIG. 21, fixed to the above-described back side 37BS of the connector support portion 37b of the printed wiring board 37. Each of the fixation portions 41B has the hole 41b at a position corresponding to the hole 40b of each of the fixation portions 40B of the upper cover 40. The common machine screws described above are inserted into the hole 40b and the hole 41b through the hole 37H1 of the printed wiring board 37 and are fastened with the nuts. Hereby, the fixation portions 40B of the upper cover 40 and fixation portions 41B of the lower cover 41 are fixed to the printed wiring board 37. At positions adjacent to the holes 41b, the protrusions 41P for positioning are formed.

The lower cover 41 is configured to accommodate the host connector 38 inside and to cover the lower part of the host connector 38 while retaining given clearances. The connector accommodation portion 41A is formed and surrounded by a pair of side walls, a connecting wall connecting the other end portions of the pair of side walls, and a lower wall which is continuous with the pair of side walls and the connecting wall and which forms the lower surface of the lower cover 41. The EMI gasket EG4 is cemented to the upper end portion of the connecting wall and the upper end portion of the side walls connected to both ends of the upper end portion of the connecting wall. The EMI gasket EG4 is pressed to the above-described ground line contact pad 37Gb when the fixation portions 41B of the lower cover 41 are fixed on the back side 37BS of the connector support portion 37b.

Therefore, the upper cover 40 and the lower cover 41 which serve as the connector cover are, when fixed to the printed wiring board 37, configured to cover the entire host connector 38 in a state where the printed wiring board 37 is cooperatively sandwiched between the upper cover 40 and the lower cover 41.

Hereby, because when the connecting end portion of the module is connected to the host connector 38, an end surface of the module comes into contact with the EMI gasket EG1 on the periphery of the slot 40SL of the upper cover 40, and the EMI gasket EG3 and the EMI gasket EG4 come into contact with the ground line contact pad 37Ga and the ground line contact pad 37Gb, respectively, whereby noise generated in the host connector 38 is confined to the inside of the connector accommodation portions 40A and 41A. In addition, static electricity and the like generated from the connector cover is brought in the ground line of the printed wiring board 37 through the connector cover.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A receptacle assembly comprising:
a guide member provided on the periphery of an opening of a wiring board which has the opening, and configured to form a module accommodation portion to detachably accommodate a module comprising a module board, and configured to guide the module;
a connector unit provided on the wiring board at a position adjacent to the module accommodation portion, and configured to electrically connect the module board of the module to the wiring board;
a first EMI gasket sealing a gap between a lower end portion of a connector cover covering the connector unit and the wiring board; and
a second EMI gasket sealing a gap between a connecting end portion of the module and the periphery of an opening of the connector unit when the module is placed to the module accommodation portion through the opening of the connector unit, wherein when the module is accommodated by the module accommodation portion, a position of a lower end portion of the module is positioned at a position lower than a position of the wiring board through an opening of the wiring board,
wherein the connector cover covering the connector unit is electrically connected to a ground line of the wiring board through a third EMI gasket and a fourth EMI gasket which are conductive and which are provided between the connector cover and a ground line contact pad formed on a surface of the wiring board.

2. The receptacle assembly according to claim 1, wherein the third EMI gasket is pressed to a first ground line contact pad which is electrically connected to the ground line of the wiring board and the fourth EMI gasket is pressed to a second ground line contact pad which is electrically connected to the ground line of the wiring board.

3. The receptacle assembly according to claim 2, wherein the first ground line contact pad is formed on the periphery of the connector unit at a surface of a connector support portion of the wiring board and an inner peripheral surface forming a part of the opening of the wiring board.

4. The receptacle assembly according to claim 2, wherein the second ground line contact pad is formed on the periphery of the connector unit at a back side of a connector support portion of the wiring board.

* * * * *